(12) United States Patent
Jang

(10) Patent No.: US 12,125,549 B2
(45) Date of Patent: *Oct. 22, 2024

(54) APPARATUS AND METHOD FOR CORRECTING AN ERROR IN DATA TRANSMISSION OF A DATA PROCESSING SYSTEM

(71) Applicant: MIMIRIP LLC, Dallas, TX (US)

(72) Inventor: In Jong Jang, Gyeonggi-do (KR)

(73) Assignee: MIMIRIP LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,978

(22) Filed: Aug. 1, 2023

(65) Prior Publication Data

US 2023/0377673 A1 Nov. 23, 2023

Related U.S. Application Data

(63) Continuation of application No. 17/196,578, filed on Mar. 9, 2021, now Pat. No. 11,756,643.

(30) Foreign Application Priority Data

Oct. 5, 2020 (KR) .......................... 10-2020-0127939

(51) Int. Cl.
*G11C 29/42* (2006.01)
*G11C 7/10* (2006.01)
*G11C 29/36* (2006.01)
*G11C 29/44* (2006.01)

(52) U.S. Cl.
CPC ............ *G11C 29/42* (2013.01); *G11C 7/1057* (2013.01); *G11C 7/1084* (2013.01); *G11C 29/36* (2013.01); *G11C 29/44* (2013.01)

(58) Field of Classification Search
CPC ......... G11C 29/42; G11C 29/36; G11C 29/44; G11C 7/1057; G11C 7/1084; G11C 2029/0411; G06F 11/1048; G06F 11/108; G06F 11/1012; G06F 11/1443; G06F 11/1004; G06F 11/1044
See application file for complete search history.

(56) References Cited

U.S. PATENT DOCUMENTS

2003/0217322 A1* 11/2003 Rodgers .............. G06F 11/1068
714/763
2020/0321983 A1* 10/2020 Qin ....................... H03M 13/19

* cited by examiner

*Primary Examiner* — Sultana Begum
(74) *Attorney, Agent, or Firm* — IP & T GROUP LLP

(57) ABSTRACT

A data processing system includes a controller configured to receive a first encoded data item and a write request from a host, the first encoded data item being encoded based on a hamming code. The controller is further configured to store the first encoded data item in a write buffer, decode the first encoded data item stored in the write buffer based on the hamming code to detect and correct a first error in the first encoded data item to obtain a first error-corrected data item, encode the first error-corrected data item based on an error correction code to generate a second encoded data item, and transmit the second encoded data item to program the second encoded data item in a non-volatile memory device.

16 Claims, 11 Drawing Sheets

(a)

|  |  |  |  |  |  |  |  |  |  | Halves | Fourths | Half |  |  |
|---|---|---|---|---|---|---|---|---|---|---|---|---|---|---|
| Data Packet (old) | 0 | 1 | 0 | 1 | 0 | 0 | 0 | 1 | ECCe= | 0^0^0^1, | 0^1^0^1, | 1^1^0^1 | = | 101 |
|  |  |  |  |  |  |  |  |  | ECCo= | 0^1^0^1, | 0^1^0^0, | 0^0^0^0 | = | 000 |

|  |  |  |  |  |  |  |  |  |  | Halves | Fourths | Half |  |  |
|---|---|---|---|---|---|---|---|---|---|---|---|---|---|---|
| Data Packet (new) | 0 | 1 | 0 | 1 | 0 | 1 | 0 | 1 | ECCe= | 0^1^0^1, | 0^1^0^1, | 1^1^1^1 | = | 000 |
|  |  |  |  |  |  |  |  |  | ECCo= | 0^1^0^1, | 0^1^0^1, | 0^0^0^0 | = | 000 |

(b)  ECCe(old)^ECCo(old)^ECCe(new)^ECCo(new) = 101^010^000^000 = 111

(c)  ECCo(old)^ECCo(new) = 010^000 = 010

(d)  01010101^00000100 = 01010001

APPARATUS AND METHOD FOR CORRECTING AN ERROR IN DATA TRANSMISSION OF A DATA PROCESSING SYSTEM

CROSS-REFERENCE TO RELATED APPLICATIONS

The present application is a continuation of U.S. patent application Ser. No. 17/196,578 filed on Mar. 9, 2021, which claims benefits of priority of Korean Patent Application No. 10-2020-0127939, filed on Oct. 5, 2020, the entire disclosure of which is incorporated herein by reference.

TECHNICAL FIELD

One or more embodiments described herein relate to a data processing system and a method of controlling a data processing system.

BACKGROUND

The use of portable electronic devices (e.g., mobile phones, digital cameras, notebook computers) continues to increase. These devices may include or use a memory system having at least one data storage device that can be used as a main storage device or auxiliary storage device.

Data storage devices that use non-volatile semiconductor memories exhibit improved stability and durability, have no mechanical driving parts (e.g., a mechanical arm), and perform with high data access speeds and relatively low power consumption compared with storage devices that use hard disks. Examples of data storage devices that use non-volatile semiconductor memories include, but are not limited to, Universal Serial Bus (USB) memory devices, memory cards having various interfaces, and solid state drives (SSDs).

BRIEF DESCRIPTION OF THE DRAWINGS

The description makes reference to the accompanying drawings wherein like reference numerals refer to like parts throughout the figures.

DETAILED DESCRIPTION

Figure 1:
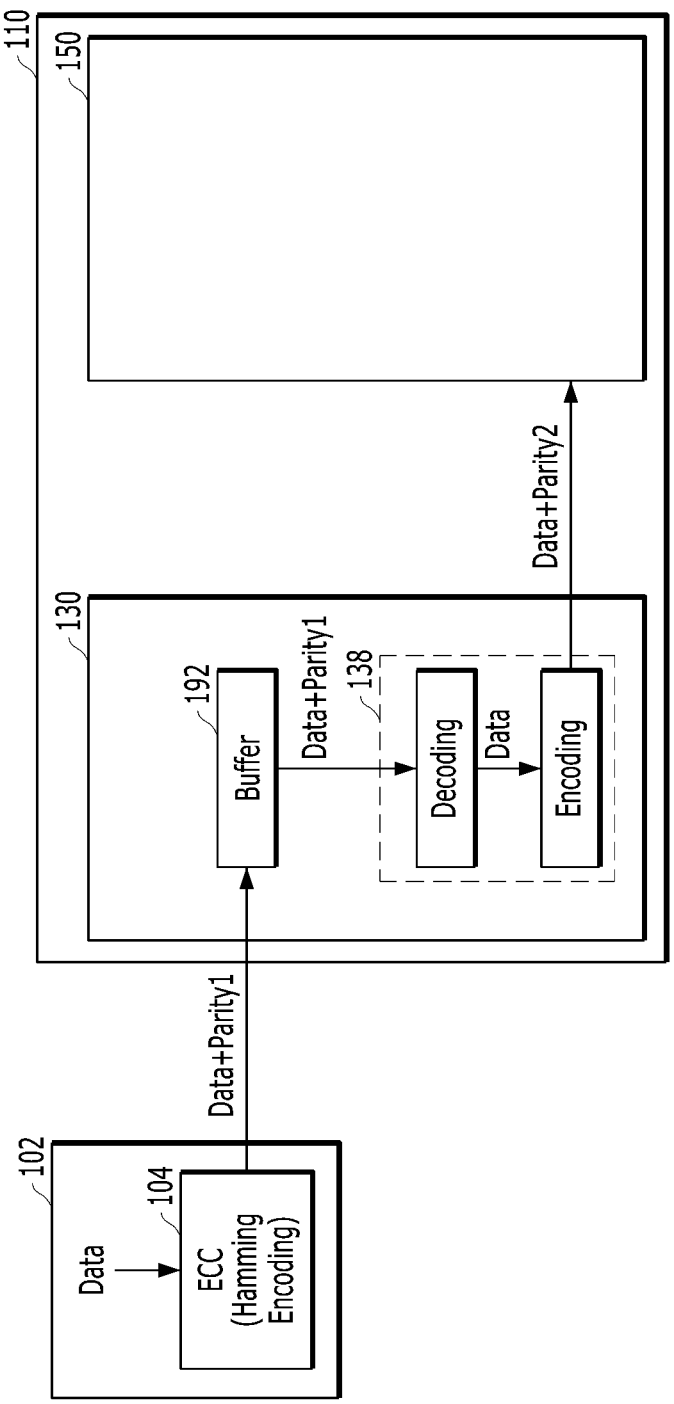
FIG. 1 illustrates an example of a data write operation in a data processing system.

Various embodiments of the disclosure are described below with reference to the accompanying drawings. Elements and features of the disclosure, however, may be configured or arranged differently to form other embodiments, which may be variations of any of the disclosed embodiments.

The terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

References to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' may refer to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data or a data item may be a sequence of bits. For example, the data item may include the contents of a file, a portion of the file, a page in memory, an object in an object-oriented program, a digital message, a digital scanned image, a part of a video or audio signal, or any other entity which can be represented by a sequence of bits. According to an embodiment, the data item may include a discrete object. According to another embodiment, the data item may include a unit of information within a transmission packet between two different components.

In accordance with one or more embodiments, a data processing system and a method for operating the data processing system (which includes components and resources such as a memory system and a host) are capable of dynamically allocating plural data paths for performing data communications based on usage of the components and the resources.

In accordance with one or more embodiments, a method and an apparatus are provided which use a code for error detection and correction (e.g., a Hamming code) so that, even if an error (e.g., a bit flip) occurs in data transmission between the host and the memory system of the data processing system, the error can be corrected to improve or enhance reliability of data stored in the memory system.

In accordance with one or more embodiments, a method and an apparatus are provided which use a code for error detection and correction (e.g., a Hamming code) so that, when an error (e.g., a bit flip) occurs in a data item temporarily stored in a buffer of the memory system, the error can be corrected to improve or enhance reliability of data stored in a memory device.

In accordance with one or more embodiments, a memory system and method are provided for determining the operation and/or location of an error occurring relative to a data item received from an external device (e.g., a host). The determination may be made while the data item is handled or processed to perform a programming operation in a non-volatile memory device. Based on information obtained through these operations, the memory system can supplement a data processing procedure to increase operational reliability.

In accordance with one or more embodiments, a method and apparatus use a Hamming code and performs a checksum operation to detect and correct multi-bit error that may occur during temporary storage in the memory system, as well as during data transmission between the host and the memory system of the data processing system.

In accordance with an embodiment, a data processing system may include a controller configured to receive a first encoded data item and a write request, the first encoded data item being encoded based on a hamming code. The controller is further configured to store the first encoded data item and in a write buffer, decode the first encoded data item stored in the write buffer based on the hamming code to detect and correct a first error in the first encoded data item to obtain a first error-corrected data item, encode the first error-corrected data item based on an error correction code to generate a second encoded data item, and transmit the second encoded data item to program the second encoded data item in a non-volatile memory device.

The first error can include an error occurring in a data communication between the host and the controller and an error occurring while the first encoded data item is temporarily stored in the write buffer.

The controller can be further configured to receive a read request from the host, read the second encoded data item programmed in the non-volatile memory device, decode the second encoded data item based on the error correction code to detect and correct a second error in the second encoded data item to obtain a second error-corrected data item, encoded the second error-corrected data item based on the hamming code to generate a first encoded read data item, store the first encoded read data item in a read buffer, and transmit the first encoded read data item, as a response for the read request, to the host.

By the way of example but not limitation, the second error can include an error occurring in the non-volatile memory device. The error correction code can include the hamming code. The error correction code can include the hamming code and a checksum.

In another embodiment, a memory system can include a memory device including non-volatile memory cells; and a controller, including a volatile memory device, configured to control the memory device. The controller can be further configured to receive a data packet including a first error correction parity corresponding to a data item from a host coupled to the memory system via a data transmission channel, store the data packet in the volatile memory device, decode the data packet based on the first error correction parity to detect and correct a first error in the data packet, occurring in the data transmission channel, and a second error in the data packet occurring in the volatile memory device.

The controller can perform a data communication with the host via the data transmission channel according to a preset protocol. The first error can include a bit flip occurring in the data packet while the data packet is transmitted and received via the data transmission channel. The second error can include a bit flip generated by an operation or a structure of the volatile memory device. The first error correction parity can be generated by an encoding process based on a hamming code.

The controller can be further configured to encode an error-corrected data item of which the first and second errors are corrected based on an error correction code to generate a second error correction parity and transmit an encoded data item including the second error correction parity to the memory device. The error correction code can include a hamming code.

The controller can be further configured to read the encoded data item in response to a read request input from the host, and decode the encoded data item based on the error correction code to detect and correct a third error included in the encoded data item. The third error can include an operation or a structure of the memory device.

The controller can be further configured to encode an error-corrected data item to generate the first error correction parity, the error-corrected data item being obtained after decoding the encoded data item in response to the read request, and transmit the error-corrected data item along with the first error correction parity to the host.

The controller can be further configured to decode the data packet including the first error correction parity, input from the host, to detect and correct the first error in the data packet, encode a first error-corrected data item in which the first error is corrected based on a first error correction code to generate a second encoded data item, store the second encoded data item in a buffer of the volatile memory device, and decode the second encoded data item to detect and correct a second error in the second encoded data item.

The controller can be further configured to encode a second error-corrected data item based on a second error correction code to transmit an encoded data item to the memory device.

The controller can be further configured to decode the data packet including the first error correction parity, input from the host, to detect and correct the first error in the data packet, encode a first error-corrected data item in which the first error is corrected based on a first error correction code to generate the second encoded data item including the data item and a parity item, and transmit the data item and the parity item to the memory device separately. The memory device can be configured to decode the data item and the parity item based on the first error correction code to detect and correct the second error in the second encoded data, and to store the data item in the non-volatile memory cells.

The memory device can include a data buffer configured to store the data item and a parity buffer configured to store parity item generated based on the first error correction code.

In another embodiment, a method for operating a memory system can include receiving a data packet including a first error correction parity corresponding to a data item from a host coupled to the memory system via a data transmission channel; storing the data packet in a volatile memory device; and decoding the data packet based on the first error correction parity to detect and correct a first error occurring in the data transmission channel and a second error occurring in the volatile memory device.

The controller can perform a data communication with the host via the data transmission channel according to a preset protocol. The first error can include a bit flip occurring in the data packet while the data packet is transmitted and received via the data transmission channel. The second error can include a bit flip generated by an operation or a structure of the volatile memory device.

The method can further include encoding an error-corrected data item of which the first and second errors are corrected based on an error correction code to generate a second error correction parity; and transmitting an encoded data item including the second error correction parity to the memory device.

In another embodiment, a method for operating a memory system can include receiving a data packet including a first error correction parity corresponding to a data item from a host coupled to the memory system via a data transmission channel; decoding the data packet based on the first error correction parity to detect and correct a first error in the data packet, occurring in the data transmission channel; encoding a first error-corrected data item of which the first error is corrected by the decoding based on the first error correction code to generate a first encoded data item including a second error correction parity; storing the first encoded data item in a volatile memory device; and decoding the first encoded data item based on the second error correction parity to detect and correct a second error in the data packet, occurring in the volatile memory device.

The controller can perform a data communication with the host via the data transmission channel according to a preset protocol. The first error can include a bit flip occurring in the data packet while the data packet is transmitted and received via the data transmission channel. The second error can include a bit flip generated by an operation or a structure of the volatile memory device.

The method can further include encoding a data item of which the first and second errors are corrected based on an error correction code to generate a second error correction parity; and transmitting an encoded data item including the second error correction parity to the memory device.

Embodiments of the present disclosure will now be described with reference to the accompanying drawings, wherein like numbers reference like elements.

FIG. 1 illustrates an example of a data write operation performed in a data processing system 100 according to an embodiment.

Referring to FIG. 1, the data processing system 100 may include a memory system 110 and a host 102. According to an embodiment, the host 102 may be a device that performs one or more operations that correspond to a user's request. The memory system 110 may temporarily and/or permanently store data or information generated, for example, while the host 102 is in operation. The memory system 110 and the host 102 may be coupled with each other to transmit and receive data items, signals, commands, requests, and/or other information in a preset manner (e.g., based on a predetermined protocol).

The memory system 110 may include a controller 130 and a memory device 150. An example of an internal configuration of the memory system 110 will be described with reference to FIGS. 3 to 4.

The host 102 may include error correction code (ECC) circuitry 104 that uses a predetermined code (e.g., a Hamming code) to encode a data item to be transmitted to the memory system 110. The host 102 may then transmit the encoded data item to the memory system 110. In one embodiment, the encoded data item may include a data item Data and a parity item Parity1, and thus may be represented as Data+Parity1.

The hamming code is a kind of self-correcting mechanism, which can detect and correct a 1-bit error occurring in the data item. An example of the 1-bit error is a bit flip, but a different type of error may be detected and corrected in another embodiment.

According to one method embodiment of using the hamming code, 1st, 2nd, 4th, 8th, ..., $2^{nth}$ bits of encoded data Data+Parity1 can be used as a parity item for error detection and correction. Examples of methods for using a hamming code for encoding purposes will be described, for example, with reference to FIG. 5.

After receiving the encoded data item Data+Parity1 from the host 102, the memory system 110 may temporarily store the encoded data item in a buffer 192. The buffer 192 may correspond, for example, to an allocated area in a volatile memory device (e.g., memory 144) included in, or controlled by, the controller 130 shown in FIGS. 2 and 3. For example, the buffer 192 may include a write buffer for storing a write data item and a read buffer for storing a read data item. Examples of the volatile memory device in, or controlled by, controller 130 are described referring to the memory 144 illustrated in FIGS. 3 to 4.

The controller 130 may include error correction circuitry 138, and may load the encoded data item Data+Parity1 temporarily stored in the buffer 192 and perform a decoding operation on the encoded data item Data+Parity1 based on the hamming code. Through the decoding operation, the error correction circuitry 138 can detect and correct a first error in a data communication between the host 102 and the memory system 110 and/or a second error that may occur in the buffer 192. Further, the error correction circuitry 138 can use an error correction code (ECC) to encode a corrected data item in which the first and/or second errors are corrected, and then transfer an encoded data item Data+Parity2 to the memory device 150.

According to an embodiment, the error correction code (ECC) circuitry 104 in the host 102 and the error correction circuitry 138 in the controller 130 may use the same error correction code or error correction technique. In this case, the design and configuration of the error correction circuitry 138 in the memory system 110 may be simplified.

According to one embodiment, the error correction code (ECC) circuitry 104 in the host 102 and the error correction circuitry 138 in the controller 130 may use different error correction codes or error correction techniques. For example, the error correction code (ECC) circuitry 104 in the host 102 can use a hamming code only, and the error correction circuitry 138 in the memory system 110 can perform a cyclic redundancy check (CRC) on a data item.

Data communication between the host 102 and the memory system 110 may be performed through at least one data transmission line according to a preset protocol. A first error (e.g., a bit flip) in a data item may occur in a process of transmitting/receiving the data item via the at least one data transmission line. For example, the first error may be caused by interference between signals transmitted via data transmission lines, power supplied to the host 102 and the memory system 110, and/or an operation performed by an apparatus for transmitting and receiving the data item between the host 102 and the memory system 110.

In one embodiment, the buffer 192 may be an area allocated in the volatile memory device. Examples of the volatile memory device include an SRAM and a DRAM. In the volatile memory device, a plurality of memory cells may be highly integrated and high operation speed may be achieved. Because of structural or operational characteristics of a volatile memory device, a bit error or a bit flip may occur in at least some of the data items stored in the buffer 192.

In the data processing system 100 shown in FIG. 1, the host 102 can encode a data item Data based on a Hamming code and transmit an encoded data item Data+Parity1 to the memory system 110. Before transmitting the data item Data to the memory device 150, the controller 130 can check whether there is an error in the data item through a decoding operation based on the hamming code. The first error and/or the second error may be found and corrected through a single decoding operation based on the Hamming code, which can be considered a self-correcting mechanism. In some cases, various errors may occur in a procedure for storing a data item Data transmitted from the host 102 in the memory device 150 (including non-volatile memory cells) in the memory system 110. In one embodiment, these various errors can be detected and corrected through a single decoding operation. As a result, a data input/output operation of the data processing system 100 can be efficiently improved, so that reliability of data items stored in the memory device 150 can be improved or enhanced.

According to an embodiment, when error correction circuitry 138 uses a hamming code or another error correction code for encoding the data item Data, the controller 130 may transmit another encoded data item Data+Parity2 to the memory device 150. When there is circuitry capable of decoding received data item based on the Hamming code (or the corresponding error correction code) within the memory device 150, an error that may occur in data communication between the controller 130 and the memory device 150 can be detected and corrected.

Figure 2:
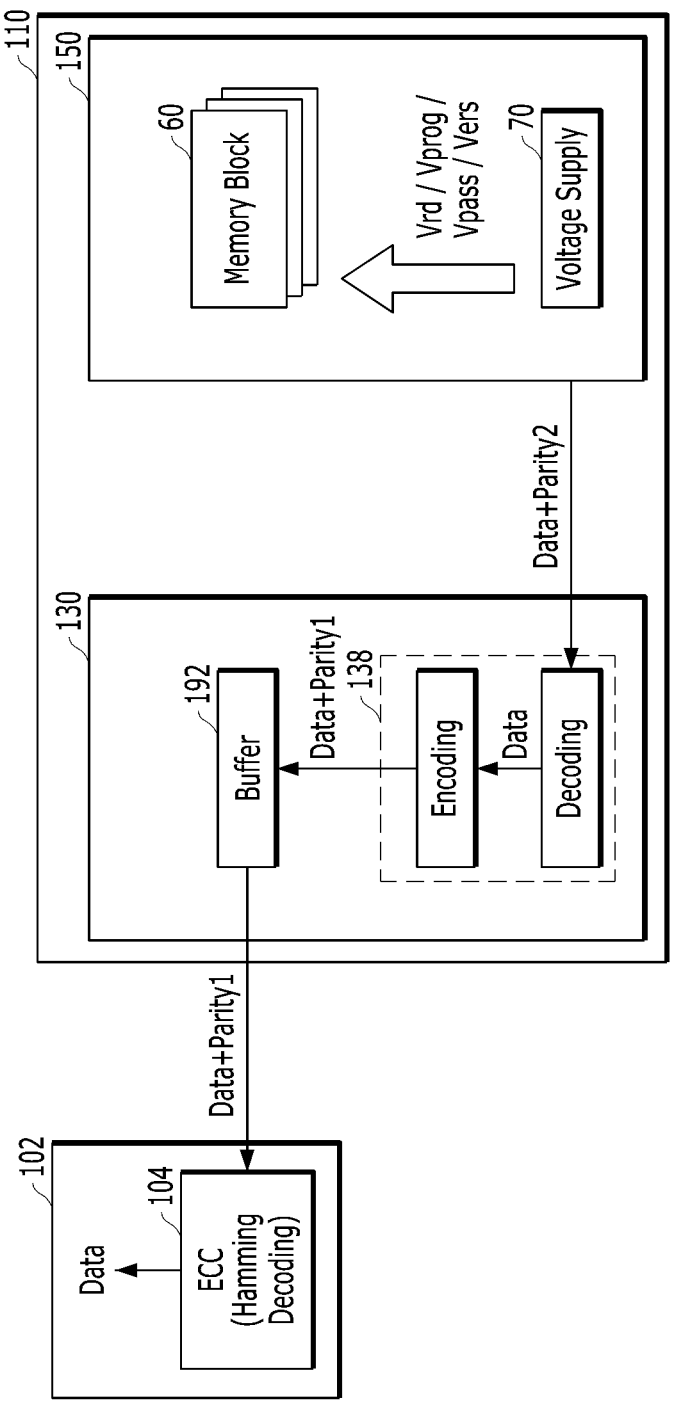
FIG. 2 illustrates an example of a data read operation in a data processing system.

FIG. 2 illustrates an example of a data read operation that may be performed in the data processing system 100 according to an embodiment. As described with reference to FIG. 1, the encoded data item Data+Parity2 may be stored in the memory device 150. Further, the controller 130 may read a data item stored in the memory device 150 in response to a read request input from the host 102.

Referring to FIG. 2, the host 102 may transmit a logical address along with the read request to the memory system 110. In some cases, the host 102 and the memory system 110 may have different address schemes. In this case, in order to store data requested by an external device (e.g., host 102 in FIGS. 2-3) in the memory device 150 (e.g., a storage space including non-volatile memory cells), the memory system 110 may perform address translation between a file system used by the host 102 and a physical location of the storage space including the non-volatile memory cells.

For example, a data address determined according to the file system used by the host 102 may be referred to as a logical address or a logical block address. An address for the physical location at which data is stored in the storage space may be referred as to a physical address or a physical block address. When the host 102 transfers a logical address to the memory system 110 together with a read request, the memory system 110 may search for a physical address associated with the logical address, read data stored in a location recognized by the physical address, and output read data to the host 102. During this procedure, address translation may be performed in the memory system 110 to search for the physical address associated with the logical address input from host 102.

The controller 130 may perform a data input/output operation in response to a request input from an external device such as the host 102. For example, when the controller 130 performs a read operation in response to a read request input from the external device, data stored in a plurality of non-volatile memory cells in the memory device 150 is transferred to the controller 130. For the read operation, the memory system 110 may perform address translation on the logical address input from the external device to obtain a physical address, and then may transmit a read command to the memory device 150 corresponding to the physical address to access and read a data item stored therein.

Further, the memory system 110 may transmit a data item input along with a write request from the external device to the memory device 150. After storing the data item in the memory device 150, the memory system 110 may transmit a response corresponding to the write request to the external device. The memory system 110 may update map data that associates the physical address (which indicates the storage location of the data item in memory device 150) with the logical address input along with the write request.

As shown in FIG. 2, the memory device 150 may include a plurality of memory blocks 60. In one embodiment, the memory block 60 may be understood to include a group of non-volatile memory cells in which data is removed together by a single erase operation. The memory block 60 may include a page, which, according to one embodiment, may correspond to a group of non-volatile memory cells that store data together during a single program operation or that output data together during a single read operation. One memory block may include, for example, a plurality of pages.

The memory device 150 may include a plurality of memory planes or a plurality of memory dies. According to an embodiment, a memory plane may be a logical or a physical partition including at least one memory block, a driving circuit capable of controlling an array including a plurality of non-volatile memory cells, and/or a buffer that temporarily stores data input to, or output from, non-volatile memory cells.

According to an embodiment, each memory die may include at least one memory plane. A memory die may be understood, for example, as a set of components implemented on a physically distinguishable substrate. Each memory die may be connected to the controller 130 through a data path, and may include an interface to exchange a data item and a signal with the controller 130.

According to an embodiment, the memory device 150 may include at least one memory block 60, at least one memory plane, and/or at least one memory die. An embodiment of the internal configuration of the memory device 150 is shown in FIG. 1. The memory device 150 may have a different internal configuration in another embodiment, for example, according to performance of the memory system 110.

Referring again to FIG. 2, the memory device 150 may include a voltage supply circuit capable of supplying one or more voltages to the memory block. In one embodiment, the voltage supply circuit may supply a read voltage Vrd, a program voltage Vprog, a pass voltage Vpass, and/or an erase voltage Vers to a non-volatile memory cell in the memory block. For example, during a read operation, the voltage supply circuit may supply read voltage Vrd to a selected non-volatile memory cell to read data stored in that memory cell. During a program operation, the voltage supply circuit may supply program voltage Vprog to a selected non-volatile memory cell to store data in that memory cell. During a read operation or a program operation performed on a selected nonvolatile memory cell, the voltage supply circuit may supply a pass voltage Vpass to a non-selected nonvolatile memory cell. During an erasing operation, the voltage supply circuit may supply erase voltage Vers to erase data stored in a non-volatile memory cell in the memory block.

The memory device 150 may store information regarding various voltages supplied to the memory block 60 based on which operation is performed. For example, when a non-volatile memory cell in the memory block can store multi-bit data, plural levels of the read voltage Vrd for recognizing or reading multi-bit data may be used. The memory device 150 may include a table including information corresponding to plural levels of the read voltage Vrd corresponding to the multi-bit data. The table can include, for example, one or more bias values stored in a register, with each bias value corresponding to a specific level of the read voltage Vrd. In some cases, the number of bias values for the read voltage Vrd may be limited to a preset range. Also, in one embodiment, the bias values can be quantized.

The memory device 150 may transmit the encoded data item Data+Parity2 (stored in the memory block 60) to the controller 130 in response to a read request transmitted from the host 102. The error correction circuitry 138 in the controller 130 can decode the encoded data item Data+Parity2 to detect and correct an error occurring in one or more of the following example cases: transmission and reception between the controller 130 and the memory device 150, an operation of programming the encoded data item Data+Parity2 in a specific memory block 60 of the memory device 150, or a change of threshold voltages while being stored in non-volatile memory cells in the corresponding memory block 60.

After detecting and correcting various ones of the above-described errors, error correction circuitry 138 may use a predetermined code (e.g., a hamming code) for encoding an error-corrected data item. The error-corrected data item Data+Parity1, which is encoded based on the hamming code, may be temporarily stored in the buffer 192 before being transmitted to the host 102. Then, the error-corrected data item Data+Parity1 may be transmitted to the host 102. According to an embodiment, when the error correction circuitry 138 does not detect and correct an error occurring in the encoded data item Data+Parity2 through a decoding process, the controller 130 may perform a read reclaim operation or another operation.

According to an embodiment, buffer 192 shown in FIG. 1 may include an input buffer and buffer 192 shown in FIG. 2 may include an output buffer. The buffer 192 may have various forms or may be divided into a plurality of areas according to it intended purpose. Examples of buffer 192 are described with reference to memory 144 of FIGS. 3 and 4.

The host 102 may receive the data item Data+Parity1 (which is encoded using a Hamming code by the memory system 110) in response to the read request. The error correction code (ECC) circuitry 104 in the host 102 can perform a decoding operation for the data item Data+Parity1 based on the hamming code, to detect and correct an error that may have occurred in data communication between the host 102 and the memory system 110.

In FIG. 2, the controller 130 can decode the encoded data item Data+Parity2 transmitted from the memory device 150 to detect and correct an error in the data item Data, encode the data item Data based on the hamming code, and store the encoded data Data+Parity1 in the buffer 192. In this case, when an error in the data item Data is detected but might not be corrected, the controller 130 may perform an operation of restoring or recovering the data item Data stored in the memory device 150 at a faster rate. Various methods or algorithms can be used to restore or recover the data item Data. However, when an error occurs due to the structure or operation of the buffer 192, the error might not be detected and corrected before the data item Data is transmitted to the host 102 in response to the read request.

According to an embodiment, the controller 130 can be configured to store the encoded data item Data+Parity2 (transmitted from the memory device 150) in the buffer 192 first. Before transmitting the data item to the host 102, the error correction circuitry 138 can decode the encoded data item Data+Parity2, so as to detect and correct an error and encode an error-corrected data item based on the hamming code to generate the encoded data item Data+Parity1. In this embodiment, the memory system 110 can detect and correct an error occurring in the structure or operation of the buffer 192, before transmitting the encoded data item Data+Parity1 to the host 102. However, in some cases, if there is an error occurring in the encoded data item Data+Parity2 output from the memory device 150, detection and correction for the corresponding error may be delayed.

Figure 3:
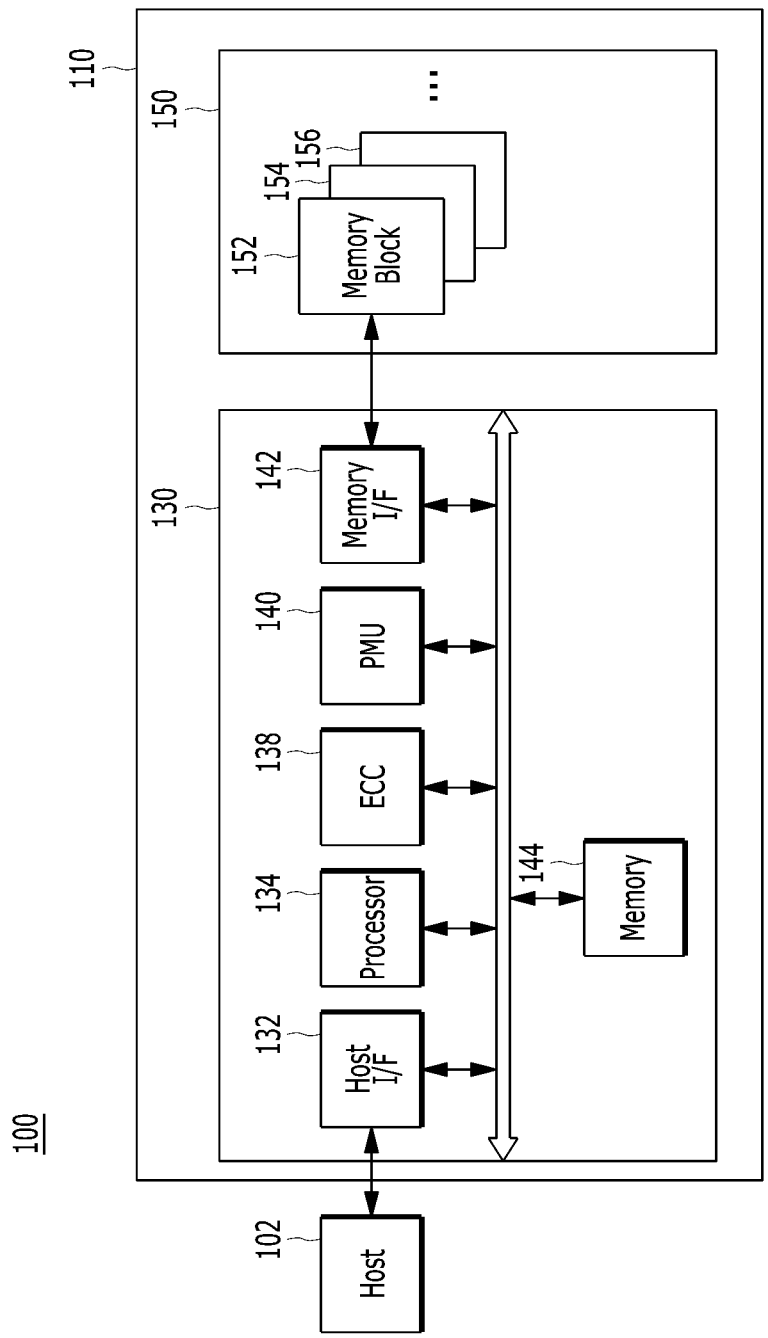
FIG. 3 illustrates an embodiment of a data processing system.
Figure 4:
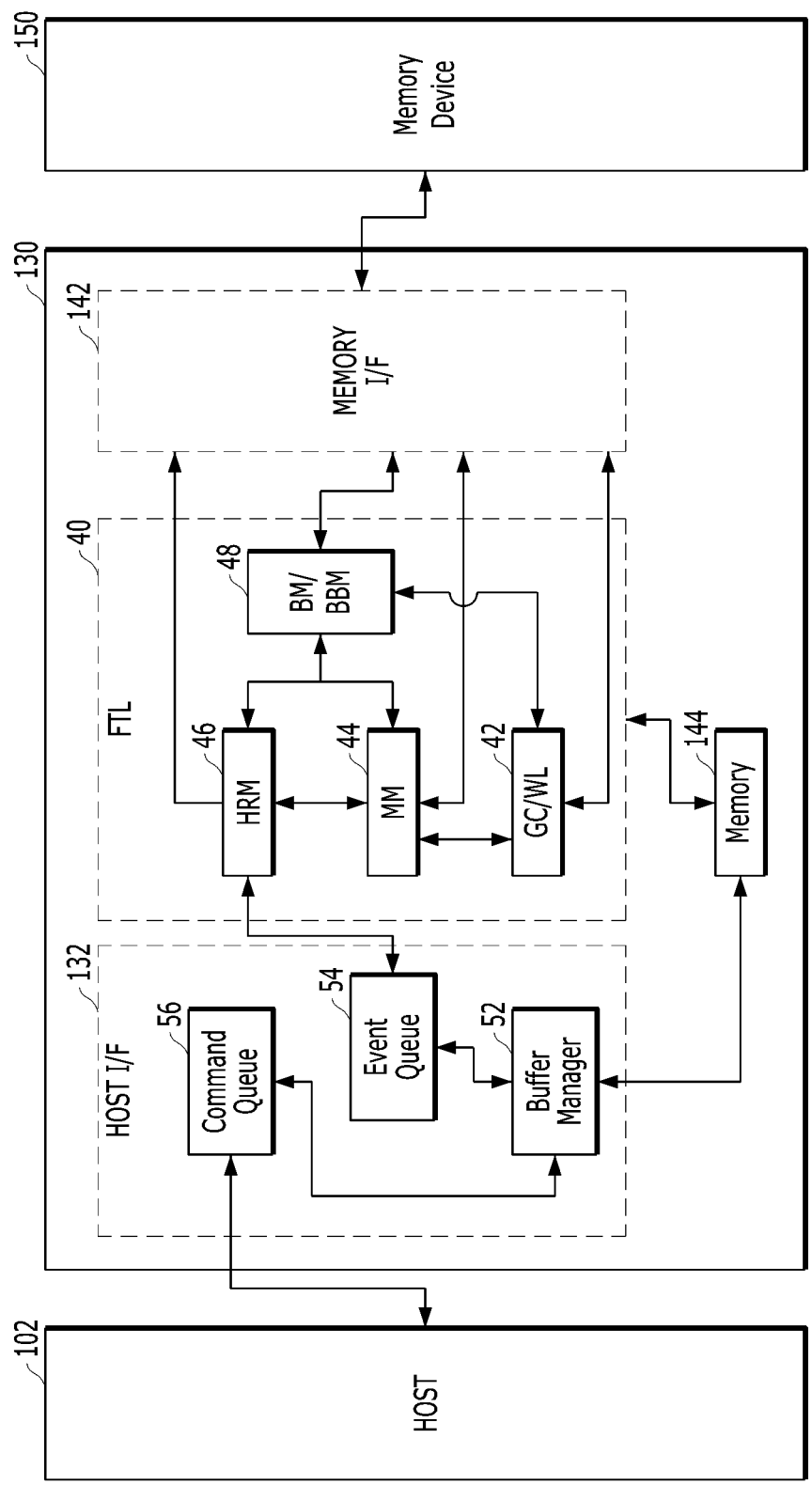
FIG. 4 illustrates an embodiment of a memory system.

FIGS. 3 and 4 illustrate operations that may be performed by the memory system 110 according to one or more embodiments.

Referring to FIG. 3, data processing system 100 may include a host 102 engaged or coupled with a memory system, such as memory system 110. The host 102 may include a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS), which can control functions and operations performed in the host 102. In one embodiment, the OS can provide interoperability between the host 102 (operatively engaged with the memory system 110) and the user who intends to store data in the memory system 110. The OS may support functions and operations corresponding to user requests.

By way of example but not limitation, the OS can be classified into a general operating system and a mobile operating system according to mobility of the host 102. The general operating system may be split into a personal operating system and an enterprise operating system according to system requirements or user environment. As compared with the personal operating system, enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems that are interlocked with the memory system 110 corresponding to a user request. The host 102 may transmit a plurality of commands corresponding to user requests to the memory system 110, to thereby performing operations corresponding to commands within the memory system 110.

The controller 130 in the memory system 110 may control the memory device 150 in response to a request or a command from the host 102. For example, controller 130 may perform a read operation to provide a data item read from the memory device 150 for the host 102 and may perform a write operation (or a program operation) to store a data item input from the host 102 in the memory device 150. In order to perform data input/output (I/O) operations, the controller 130 may control and manage one or more predetermined internal operations, e.g., data read, data program, data erase, or other operations.

According to an embodiment, the controller 130 can include a host interface 132, a processor 134, the error correction circuitry 138, a power management unit (PMU) 140, a memory interface 142, and a memory 144. Components in the controller 130 as illustrated in FIG. 3 may vary among embodiments based on, for example, structure, function, operation performance or the like regarding the memory system 110. For example, the memory system 110 may be implemented with various types of storage devices electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components in the controller 130 may be added or omitted based on implementation of the memory system 110.

The host 102 and the memory system 110 may include a controller or an interface for transmitting and receiving signals, a data item, and/or other information in accordance with one or more predetermined protocols. For example, the host interface 132 in the memory system 110 may include an apparatus capable of transmitting signals, a data item, and/or other information to the host 102 or receiving signals, a data item, and/or other information from the host 102.

The host interface 132 in (or coupled to) the controller 130 may receive signals, commands (or requests), a data item, and/or other information from the host 102. For example, the host 102 and the memory system 110 may use a predetermined protocol to transmit and receive a data item between each other. Examples of protocols or interfaces which may be supported by the host 102 and/or the memory system 110 for sending and receiving one or more of the aforementioned types of information include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), and Mobile Industry Processor Interface (MIPI). According to an embodiment, the host interface 132 may be a type of layer for exchanging a data item with the host 102 and may be implemented with, or driven by, instructions, including but not limited to firmware corresponding to a host interface layer (HIL).

The Integrated Drive Electronics (IDE) or Advanced Technology Attachment (ATA) may be used, for example, as at least one of the interfaces for transmitting and receiving a data item. In one example case, the interface may use a cable including 40 wires connected in parallel to support data transmission and reception between the host 102 and the memory system 110. When a plurality of memory systems 110 are connected to a single host 102, the plurality of memory systems 110 may be divided into a master and a slave, for example, based on the position or dip switch to which the plurality of memory systems 110 are connected. In one embodiment, the memory system 110 set as the master may be used as the main memory device. The IDE (ATA) may include, for example, Fast-ATA, ATAPI, and Enhanced IDE (EIDE).

Serial Advanced Technology Attachment (SATA) is one type of serial data communication interface compatible with various ATA standards that support parallel data communication interfaces used by Integrated Drive Electronics (IDE) devices. In a SATA interface, the larger number of wires (e.g., 40 wires) used in the IDE interface can be reduced to a smaller number of wires, e.g., six wires. In this case, for example, 40 parallel signals for the IDE can be converted to 6 serial signals for SATA for transmission between each other. SATA has been widely used because it may achieve faster data transmission and reception rates and may consume less resources in the host 102, when used for data transmission and reception.

In one implementation, SATA may support connection with up to external devices to a single transceiver in the host 102. In addition, SATA can support hot plugging that allows an external device to be attached or detached from the host 102, even while data communication between the host 102 and another device is being executed. Thus, the memory system 110 can be connected or disconnected as an additional device (e.g., similar to a device supported by a Universal Serial Bus (USB)), even when the host 102 is powered on. In one example, the memory system 110 may be freely detached like an external hard disk when the host 102 is implemented with an eSATA port.

Small Computer System Interface (SCSI) is one type of serial data communication interface that may be used for connection between or among computers, servers, and/or other peripheral devices. SCSI can provide relatively high transmission speeds compared with other interfaces such as IDE and SATA. In SCSI, the host 102 and at least one peripheral device (e.g., memory system 110) may be connected in series, but data transmission and reception between the host 102 and each peripheral device may be performed by parallel data communication. In SCSI, it may be easy to connect/disconnect a device (such as the memory system 110) to/from host 102. Also, in some implementations, SCSI can support connections of 15 other devices to a single transceiver host 102.

Serial Attached SCSI (SAS) may be understood as a serial data communication version of the SCSI. In SAS, not only the host 102 and a plurality of peripheral devices are connected in series, but also data transmission and reception between the host 102 and each peripheral device may be performed in a serial data communication scheme. SAS can support connection between the host 102 and a peripheral device through a serial cable instead of a parallel cable, can easily manage equipment using SAS, and can enhance or improve operational reliability and communication performance. In one implementation, SAS may support connections of eight external devices to a single transceiver the host 102.

The Non-volatile memory express (NVMe) is a type of interface based at least on a Peripheral Component Interconnect Express (PCIe), which is designed to increase performance and design flexibility of hosts, servers, computing devices, and the like equipped with non-volatile memory systems. For example, PCIe can use a slot or a specific cable for connecting host 102 (e.g., a computing device) and memory system 110 (e.g., a peripheral device). In one case, PCIe can use a plurality of pins (for example, 18 pins, 32 pins, 49 pins, 82 pins, etc.) and at least one wire (e.g., ×1, ×4, ×8, ×16, etc.) to achieve high speed data communication (e.g., 250 MB/s, 500 MB/s, 984.6250 MB/s, 1969 MB/s, etc.). According to an embodiment, a PCIe scheme may achieve bandwidths of tens to hundreds of Giga bits per second. Moreover, a system using NVMe can make the most of the operational speed of non-volatile memory system 110 (e.g., SSD), which operates at a higher speed than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and a peripheral device, such as a keyboard, a mouse, a joystick, a printer, a scanner, a storage device, a modem, a video camera, and the like. A plurality of peripheral devices such as the memory system 110 may be coupled to a single transceiver in the host 102.

Referring to FIG. 3, the error correction circuitry 138 can correct error bits of the data to be processed in (e.g., output from) the memory device 150, which may include an error correction code (ECC) encoder and an ECC decoder. The ECC encoder can perform error correction encoding of data to be programmed in the memory device 150, and may generate encoded data into which one or more parity bits may be added.

In one embodiment, the encoded data may then be stored in memory device 150. The ECC decoder can detect and correct errors in data read from the memory device 150 when the controller 130 reads the data stored in the memory device 150. For example, after performing error correction decoding on the data read from the memory device 150, the error correction circuitry 138 can determine whether the error correction decoding has succeeded and then may output an instruction signal (e.g., a correction success signal or a correction fail signal). The error correction circuitry 138 can use a parity bit generated during the ECC encoding process for correcting the error bit of the read data. When the number of the error bits is greater than or equal to a threshold number of correctable error bits, the error correction circuitry 138 might not correct error bits but instead may output an error correction fail signal indicating failure in correcting the error bits.

According to an embodiment, the error correction circuitry 138 may perform an error correction operation based on a type of coded modulation. Examples of codes which may be used to perform the coded modulation include low density parity check (LDPC) code, Bose-Chaudhuri-Hocquenghem (BCH) code, turbo code, Reed-Solomon (RS) code, convolution code, recursive systematic code (RSC), trellis-coded modulation (TCM), Block coded modulation (BCM), or another code. The error correction circuitry 138 may include all circuits, modules, systems, and/or devices for performing the error correction operation based on at least one of the above described codes.

For example, the ECC decoder may perform hard decision decoding or soft decision decoding to data transmitted from the memory device 150. The hard decision decoding can be understood as one of two methods broadly classified for error correction. Hard decision decoding may include an operation of correcting an error by reading digital data of '0' or '1' from a non-volatile memory cell in the memory device 150. Because the hard decision decoding handles a binary logic signal, the circuit/algorithm design or configuration may be simpler and processing speed may be faster than soft decision decoding in some cases.

Soft decision decoding may quantize a threshold voltage of a non-volatile memory cell in the memory device 150 by two or more quantized values (e.g., multiple bit data, approximate values, an analog value, and the like) in order to correct an error based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability (not simply data of 1 or 0 like hard decision decoding) and iteratively repeats it through a message exchange in order to improve reliability of the values. Then, the values are finally determined as data of 1 or 0.

For example, a decoding algorithm using LDPC codes can be understood as probabilistic decoding. Hard decision decoding in which the value output from a non-volatile memory cell is coded as 0 or 1. Compared to hard decision decoding, soft decision decoding can determine the value stored in the non-volatile memory cell based on the stochastic information. Regarding bit-flipping (which may be considered an error that can occur in the memory device 150), soft decision decoding may provide improved probability of correcting error and recovering data, as well as provide reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) code for soft decision decoding. The LDPC-CCs code may have a scheme using a linear time encoding and a pipeline decoding based on a variable block length and a shift register.

According to an embodiment, the ECC decoder may use, for example, a Log Likelihood Ratio Turbo Code (LLR-TC) for soft decision decoding. The Log Likelihood Ratio (LLR) may be calculated as a non-linear function for a distance between a sampled value and an ideal value. In addition, Turbo Code (TC) may include a simple code (for example, a Hamming code) in two or three dimensions and repeat decoding in a row direction and a column direction to improve reliability of values.

The power management unit (PMU) 140 may control electrical power provided in/to the controller 130. The PMU 140 may monitor the electrical power supplied to the memory system 110 (e.g., a voltage supplied to controller 130) and may provide electrical power to components in the controller 130. The PMU 140 can detect not only power-on or power-off, but also can generate a trigger signal to enable the memory system 110 to back up a current state urgently when the electrical power supplied to the memory system 110 is unstable or otherwise deviates from a predetermined level or pattern. According to an embodiment, the PMU 140 may include a device or a component capable of accumulating electrical power that may be used in an emergency or at other predetermined times or conditions.

The memory interface 142 may serve as an interface for handling commands and data transferred between the controller 130 and memory device 150, in order to allow the controller 130 to control the memory device 150 in response to a command or a request from the host 102. When, for example, memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 may include a NAND flash controller (NFC). The memory interface 142 can serve as an interface for handling commands and data between controller 130 and memory device 150. In accordance with an embodiment, memory interface 142 can be implemented through, or driven by, instructions including, but not limited to, firmware including a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, ONFi may use a data path (e.g., a channel, a way, etc.) that includes at least one signal line capable of supporting bi-directional transmission and reception in units of n-bit data, where n is 8, 16 or another number. Data communication between the controller 130 and the memory device 150 can be achieved through at least one interface regarding, for example, an asynchronous single data rate (SDR), a synchronous double data rate (DDR) or a toggle double data rate (DDR).

The memory 144 may be a type of working memory in the memory system 110 or controller 130 and may store temporary or transactional data occurring or delivered for operations in the memory system 110 and controller 130. For example, memory 144 may temporarily store read data output from the memory device 150 in response to a request from the host 102, before the read data is output to the host 102. In addition, the controller 130 may temporarily store write data input from the host 102 in the memory 144, before programming the write data in the memory device 150. When the controller 130 controls operations (such as data read, data write, data program, data erase, etc.) of the memory device 150, a data item transmitted or generated between the controller 130 and the memory device 150 of memory system 110 may be stored in memory 144.

In addition to the read data or write data, memory 144 may store information (e.g., map data, read requests, program requests, etc.) for inputting or outputting data between the host 102 and the memory device 150. According to an embodiment, the memory 144 may include a plurality of areas allocated for a command queue, a program memory, a data memory, a write buffer/cache shown in FIG. 1, a read buffer/cache shown in FIG. 2, a data buffer/cache, a map buffer/cache, and/or the like. The controller 130 may allocate some storage space in the memory 144 for a component which is established to carry out a data input/output operation. For example, the write buffer in the memory 144 may be used to temporarily store target data subject to a program operation.

In an embodiment, memory 144 may be implemented with a volatile memory. Examples include a static random access memory (SRAM), a dynamic random access memory (DRAM), or both. Although FIG. 2 illustrates an example where memory 144 is within controller 130, the embodiments are not limited thereto. The memory 144 may be located within or external to the controller 130 among various embodiments. For instance, memory 144 may be embodied by an external volatile memory having a memory interface transferring data and/or signals between the memory 144 and the controller 130.

The processor 134 may control overall operations of the memory system 110. For example, the processor 134 can control a program operation or a read operation of the memory device 150, in response to a write request or a read request from the host 102. According to an embodiment, the processor 134 may execute firmware to control the program operation or the read operation in the memory system 110. In one embodiment, firmware may correspond to as a flash translation layer (FTL). An example of an FTL is described with reference to FIG. 4. According to an embodiment, the processor 134 may be implemented with a microprocessor or a central processing unit (CPU).

According to an embodiment, the memory system 110 may be implemented with at least one multi-core processor. The multi-core processor may be a type of circuit or chip which includes two or more integrated cores that operate as distinct processing regions. For example, when a plurality of cores in the multi-core processor drive or execute a plurality of flash translation layers (FTLs) independently, data input/output speed (or performance) of the memory system 110 may be improved. According to an embodiment, the data input/output (I/O) operations in the memory system 110 may be independently performed through different cores in the multi-core processor.

In one embodiment, the processor 134 in the controller 130 may perform an operation corresponding to a request or a command from the host 102. In one embodiment, the memory system 110 may be independent of a command or a request input from an external device such as host 102. An operation performed by controller 130 in response to a request or command from the host 102 may be considered a foreground operation, while an operation performed by the controller 130 independently (e.g., regardless of a request or command from the host 102) may be considered a background operation. The controller 130 can perform foreground or background operations for read, write or program, erase and the like, regarding a data item in the memory device 150.

A foreground operation may include, for example, a parameter set operation that corresponds to set command transmitted from the host 102. Examples of the set command include a set parameter command or a set feature command. A background operation may be performed in accordance with or without a command transmitted from the host 102. Examples of a background operation that may be performed by controller 130 include, but are not limited to, garbage collection (GC), wear leveling (WL), bad block management for identifying and processing bad blocks, or the like. Background operations may be performed, for example, in relation to a plurality of memory blocks 152, 154, 156 in the memory device 150.

Variations are possible. According an embodiment, substantially similar operations may be performed as both foreground and background operations. For example, when the memory system 110 performs garbage collection in response to a request or a command from the host 102 (e.g., Manual GC), garbage collection can be considered a foreground operation. When the memory system 110 performs garbage collection independently of the host 102 (e.g., Auto GC), garbage collection can be considered a background operation.

When the memory device 150 includes a plurality of dies or chips with non-volatile memory cells, the controller 130 may be configured to perform parallel processing regarding plural requests or commands from the host 102, in order to improve performance of the memory system 110. For example, transmitted requests or commands may be divided and processed in parallel within at least some of a plurality of planes, a plurality of dies or a plurality of chips in memory device 150. The memory interface 142 in the controller 130 may be connected to a plurality of planes, dies or chips in the memory device 150, for example, through at least one channel and at least one way. When the controller 130 distributes and stores data in a plurality of dies (e.g., through respective channels or ways) in response to requests or commands associated with a plurality of pages of non-volatile memory cells, plural operations corresponding to the requests or commands can be performed individually or in parallel. Such a processing method or scheme can be considered as an interleaving method. Because data input/output speed of the memory system 110 operating with the interleaving method may be faster than those implemented by other methods, data I/O performance of the memory system 110 can be improved.

By way of example but not limitation, the controller 130 can recognize statuses regarding a plurality of channels (or ways) associated with a plurality of memory dies in the memory device 150. The controller 130 may determine the status of each channel or each way as, for example, one of a busy status, a ready status, an active status, an idle status, a normal status, and/or an abnormal status. The determination of which channel or way an instruction (and/or a data) is delivered through by the controller can be associated with a physical block address, e.g., which die(s) the instruction (and/or data) is delivered into. In this regard, the controller 130 can refer to descriptors delivered from the memory device 150. The descriptors can include a block or page of parameters that describe one or more features of the memory device 150, e.g., which features may indicate a set format or structure for data. For instance, the descriptors may include device descriptors, configuration descriptors, unit descriptors, and the like. The controller 130 can refer to, or use, the descriptors to determine which channel(s) or way(s) through which an instruction or data is exchanged.

Referring to FIG. 3, the memory device 150 in the memory system 110 may include the plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells that are erased together. The memory block 152, 154, 156 may include a plurality of pages, which correspond to one or more groups of non-volatile memory cells read or which may be programmed together. In one embodiment, each memory block 152, 154, 156 may have a three-dimensional stack structure for high integration. Further, the memory device 150 may include a plurality of dies, with each die including a plurality of planes and with each plane including the plurality of memory blocks 152, 154, 156. The configuration of the memory device 150 may vary among embodiments, for example, based on features and/or a desired level of performance of the memory system 110.

In the example of FIG. 3, the plurality of memory blocks 152, 154, 156 are in memory device 150. The plurality of memory blocks 152, 154, 156 can be any of single-level cell (SLC) memory blocks, multi-level cell (MLC) Cell) memory blocks, or the like, according to the number of bits that can be stored or represented in one memory cell. An SLC memory block includes a plurality of pages implemented by memory cells, each storing one bit of data. An SLC memory block can have high data I/O operation performance and high durability. An MLC memory block includes a plurality of pages implemented by memory cells, each storing multi-bit data (e.g., two bits or more). The MLC memory block can have larger storage capacity for the same space compared to the SLC memory block and can be highly integrated in terms of storage capacity.

In an embodiment, the memory device 150 may be implemented with MLC memory blocks. Examples include a double level cell (DLC) memory block, a triple-level cell (TLC) memory block, a quadruple-level cell (QLC) memory block, and combinations thereof. A double-level cell (DLC) memory block may include a plurality of pages implemented by memory cells, each capable of storing 2-bit data. A triple-level cell (TLC) memory block can include a plurality of pages implemented by memory cells, each capable of storing 3-bit data. A quadruple-level cell (QLC) memory block can include a plurality of pages implemented by memory cells, each capable of storing 4-bit data. In one embodiment, memory device 150 can be implemented with a block including a plurality of pages implemented by memory cells, each capable of storing five or more bits of data.

According to an embodiment, the controller 130 may use a multi-level cell (MLC) memory block in the memory device 150, such as an SLC memory block that stores one-bit data in one memory cell. A data input/output speed of the multi-level cell (MLC) memory block can be different from (e.g., slower than) that of the SLC memory block. For example, when the MLC memory block is used as the SLC memory block, the margin for a read or program operation can be reduced. The controller 130 can utilize a faster data input/output speed of the multi-level cell (MLC) memory block when using the multi-level cell (MLC) memory block as the SLC memory block. For example, the controller 130 can use the MLC memory block as a buffer to temporarily store a data item, because the buffer may require high data input/output speed for improving performance of the memory system 110.

Further, according to an embodiment, the controller 130 may program data in a multi-level cell (MLC) a plurality of times without performing an erase operation on a specific MLC memory block in the memory device 150. Non-volatile memory cells do not support data overwrite. However, the controller 130 may use a feature in which a multi-level cell (MLC) may store multi-bit data, in order to program plural pieces of 1-bit data in the MLC a plurality of times. For a MLC overwrite operation, the controller 130 may store the number of program times as separate operation information when a single piece of 1-bit data is programmed in a non-volatile memory cell. According to an embodiment, an operation for uniformly levelling threshold voltages of non-volatile memory cells can be carried out before other data is overwritten in the same non-volatile memory cells.

In an embodiment, the memory device 150 is embodied as a non-volatile memory such as a flash memory, for example, as a NAND flash memory, a NOR flash memory, and the like. In an embodiment, the memory device 150 may be implemented by at least one of a phase change random access memory (PCRAM), a ferroelectrics random access memory (FRAM), a spin injection magnetic memory (SU-RAM), and a spin transfer torque magnetic random access memory (STT-MRAM), or the like.

Referring to FIG. 4, controller 130 in a memory system operates with host 102 and memory device 150. As illustrated, the controller 130 includes a host interface 132, a flash translation layer (FTL) 240, as well as the memory interface 142, and the memory 144 previously discussed in connection with FIG. 3.

According to an embodiment, the error correction circuitry 138 illustrated in FIG. 3 may be included in the flash translation layer (FTL) 240. In one embodiment, the error correction circuitry 138 may be implemented as a separate module, a circuit, firmware, or the like, which is in, or associated with, the controller 130.

The host interface 132 may be capable of handling commands, data, and the like, transmitted from the host 102. By way of example but not limitation, the host interface 132 may include a command queue 56, a buffer manager 52, and an event queue 54. The command queue 56 may sequentially store commands, data, and the like, received from the host 102 and output them to the buffer manager 52, for example, in a predetermined order, e.g., an order in which they are stored. The buffer manager 52 may classify, manage, or adjust the commands, data, and the like, received from the command queue 56. The event queue 54 may sequentially transmit events for processing the commands, data, and the like, received from the buffer manager 52.

A plurality of commands or data of the same characteristic (e.g., read or write commands) may be transmitted from the host 102, or plurality of commands and data of different characteristics may be transmitted to the memory system 110 after being mixed or jumbled by the host 102. For example, a plurality of commands for reading data (read commands) may be delivered, or commands for reading data (read command) and programming/writing data (write command) may be alternately transmitted to the memory system 110. The host interface 132 may store commands, data, and the like transmitted from the host 102 to the command queue 56 sequentially. Thereafter, the host interface 132 may estimate or predict what type of internal operation the controller 130 will perform according to one or more characteristics of the commands, data, and the like from the host 102. The host interface 132 can determine processing order and/or priority of commands, data and the like, for example, based on at least one or more of their characteristics.

The buffer manager 52 in the host interface 132 may be configured to determine whether the buffer manager should store commands, data, and the like in the memory 144, or whether the buffer manager should deliver the commands, data, and the like to the flash translation layer (FTL) 240. These determinations may be made, for example, based on characteristics of the commands, data, and the like transmitted from the host 102.

The event queue 54 receives events which are input from the buffer manager 52 to be internally executed and processed by the memory system 110 or the controller 130. This operation may be performed, for example, in response to the commands, data, and the like transmitted from the host 102. The events may be delivered into the flash translation layer (FTL) 240 in a certain order, e.g., the order received.

In accordance with an embodiment, the flash translation layer (FTL) 240 illustrated in FIG. 4 may implement a multi-thread scheme to perform data input/output (I/O) operations. A multi-thread FTL may be implemented through a multi-core processor using multi-thread in the controller 130.

In accordance with an embodiment, the flash translation layer (FTL) 240 can include a host request manager (HRM) 46, a map manager (MM) 44, a state manager 42, and a block manager 48. The host request manager (HRM) 46 can manage the events entered from the event queue 54. The map manager (MM) 44 can handle or control a map data. The state manager 42 can perform garbage collection (GC) or wear leveling (WL). The block manager 48 can execute commands or instructions onto a block in the memory device 150.

By way of example but not limitation, the host request manager (HRM) 46 can use the map manager (MM) 44 and the block manager 48 to handle or process requests according to the read and program commands, and events which are delivered from the host interface 132. The host request manager (HRM) 46 can send an inquiry request to the map manager (MM) 44, to determine a physical address corresponding to the logical address input with the events. The host request manager (HRM) 46 can send a read request with the physical address to the memory interface 142, to process the read request (handle the events). In an embodiment, the host request manager (HRM) 46 can send a program request (write request) to the block manager 48 to program data to a specific empty page (no data) in the memory device 150, and then can transmit a map update request corresponding to the program request to the map manager (MM) 44, in order to update an item relevant to the programmed data in information of mapping the logical-physical addresses to each other.

The block manager 48 can convert a program request delivered from the host request manager (HRM) 46, the map manager (MM) 44, and/or the state manager 42, to a flash program request for use by the memory device 150 to manage flash blocks in the memory device 150. To maximize or enhance program or write performance of the memory system 110 (e.g., see FIG. 3), the block manager 48 may collect program requests and send flash program requests for multiple-plane and one-shot program operations to the memory interface 142. In an embodiment, the block manager 48 sends several flash program requests to the memory interface 142 to enhance or maximize parallel processing of the multi-channel and multi-directional flash controller.

In an embodiment, the block manager 48 can be configured to manage blocks in the memory device 150 according to the number of valid pages, select and erase blocks having no valid pages when a free block is needed, and select a block including the least number of valid pages when a garbage collection operation is to be performed. The state manager 42 can perform garbage collection (to move the valid data to an empty block and erase the blocks containing the moved valid data) so that the block manager 48 may have enough free blocks (empty blocks with no data).

When the block manager 48 provides information regarding a block to be erased to the state manager 42, the state manager 42 may check all flash pages of the block to be erased to determine whether each page is valid. For example, to determine validity of each page, the state manager 42 can identify a logical address recorded in an out-of-band (OOB) area of each page. To determine whether each page is valid, the state manager 42 can compare the physical address of the page with the physical address mapped to the logical address obtained from the inquiry request. The state manager 42 sends a program request to the block manager 48 for each valid page. A mapping table can be updated through an update operation of the map manager 44 when the program operation is complete.

The map manager 44 can manage a logical-physical mapping table. The map manager 44 can process various requests (e.g., queries, updates, etc.) generated by the host request manager (HRM) 46 or the state manager 42. The map manager 44 may store all or a portion of the mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

When garbage collection is performed, the state manager 42 may copy valid page(s) to one or more free blocks, and the host request manager (HRM) 46 can program the latest version of the data for the same logical address(es) of the page(s) and currently issue update request(s). When the state manager 42 requests a map update in a state where copying of valid page(s) is not completed normally, the map manager 44 might not perform the mapping table update. This is because the map request may be issued with old physical information when the state manger 42 requests a map update and a valid page copy is completed at a later time. The map manager 44 may perform a map update operation to ensure accuracy when, or only if, the latest map table still points to the old physical address.

Figure 5:
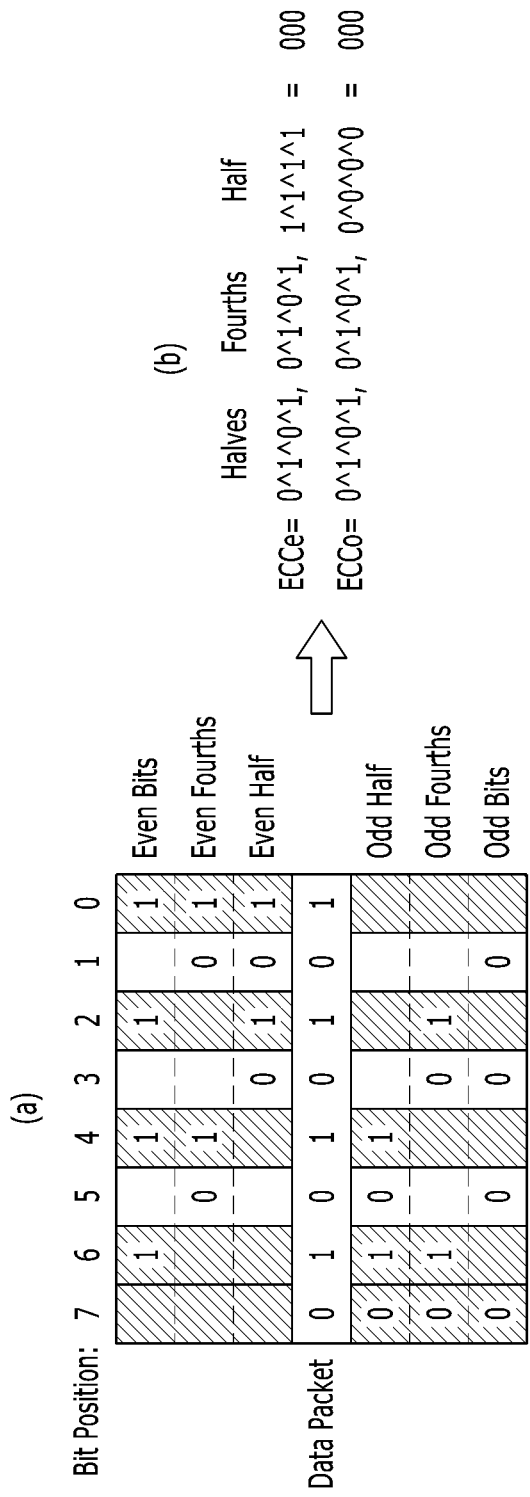
FIG. 5 illustrates an embodiment that applies a Hamming code in a data processing system.

FIG. 5 illustrates a Hamming code that may be applied in a data processing system according to an embodiment. In this embodiment, it may be assumed that a page in the memory block 60 of the memory device 150 includes a user data space of 512 bytes and a spare space of 16 bytes. The page may include a user data space and/or a spare space of different sizes in other embodiments.

In the hamming code, the number of bits of error correction parity for a data item having a length of $2^n$ bits may be n bits. Accordingly, the number of bits of the error correction parity for 512 bytes of data may be 12 bits. A data item of 512 bytes and an error correction parity of 12 bits can therefore be stored in a single page, e.g., a data item of 512 bytes may be stored in the user data space, and the error correction parity of 12 bits may be stored in the spare area.

An error correction mechanism using the Hamming code can detect and recover a single bit data error in a data item and can detect a 2-bit data error in the data item. Referring to section (a) of FIG. 5, error correction circuitry 138 may use the hamming code as a basis for calculating two Error Correction Code (ECC) values (ECCe, ECCo) from an 8-bit data item ('01010101'). For example, a 3-bit error correction parity can be used for an 8-bit (23 bit) data item. Each bit of the two ECC values (ECCe ECCo) may represent an error correction parity for one half of the bits in the data item. In section (a) of FIG. 5, a method is described in which data bits are divided for each error correction parity calculation. In order to calculate the ECC values (ECCe, ECCo), the data bits can be divided into ½, ¼, ⅛, etc., segments until the individual bit level is reached.

Referring to section (b) of FIG. 5, after the 8-bit data item is divided, an error correction parity of each group may be calculated to generate two ECC values (ECCe, ECCo). Each calculation can generate a parity of one of data partitions, and the response may indicate whether the parity of the corresponding partition is even or odd. The response can be concatenated to construct the ECC values (ECCe, ECCo).

In one embodiment, the two ECC values (ECCe, ECCo) generated through a segmentation process can be referred to as an even ECC value ECCe and an odd ECC value ECCo. The even ECC value ECCe for the 8-bit data packet '01010101' may be calculated as '000'. The odd ECC value ECCo may also be calculated as '000'. The most significant bit (MSB) of the ECC value (ECCe, ECCo), which is the error correction parity, may correspond to an area that corresponds to ½ of the data packet, the next most significant bit may correspond to another area that corresponds to ¼, and the least significant bit may correspond to another area that corresponds to ⅛. Based on the most-significant ordering or the least-significant ordering, controller 130 may recognize a position where an error (e.g., a bit flip or another type of error) occurs when the 8-bit data item is decoded.

According to an embodiment, larger data items may have larger ECC values. For example, an n-bit ECC value may be suitable for $2^n$ bits of data (e.g., an 8-bit error correction parity may be suitable for a 256 (=28) bit data item). Because the hamming code may be used for a pair of ECC values, controller 130 may use a bit space of 2×n bits to handle a $2^n$ bits data item (e.g., a 16-bit space corresponding to two 8-bit ECC values may be used for a 256-bit data item).

According to an embodiment, after the encoding operation is performed based on the hamming code, the controller 130 may program a data item and one or more corresponding ECC values into the memory device 150. When reading the data item stored in the memory device 150, the controller 130 may also read the corresponding ECC value(s) and re-calculate an ECC value (e.g., a decoding process). When a newly calculated ECC value is different from the corresponding ECC value previously programmed in the memory device 150, it may be determined that an error (e.g., a bit flip) is included in the data item.

Figure 6:
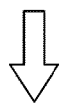
FIG. 6 illustrates an embodiment for performing error detection and correction based on a Hamming code.
Figure 6:
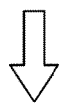
Figure 6:
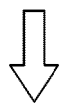

FIG. 6 illustrates a method of performing error detection and correction based on a Hamming code applied in a data processing system according to an embodiment.

Referring to section (a) of FIG. 6, it is assumed that a first data item Data Packet (old) stored in a specific location (e.g., page) in the memory device 150 was '01010001' and the second data item Data Packet (new) read in response to a read request is '01010101'. That is, it is assumed that a bit flip (change from '0' to '1') occurs at a second position (Bit Position 2) in an 8-bit data item. Because the first data item Data Packet (old) is '01010001', the even ECC value ECCe (old) for the first data item is '101' and the odd ECC value ECCo (old) for the first data item is '010'. However, because the second data item Data Packet (new) is '01010101', the even ECC value ECCe (new) for the second data item is '000' and the odd ECC value ECCo (new) for the second data item is '000.' Because the ECC value newly calculated by the controller 130 is different from the ECC value previously programmed in the memory device 150, it may be determined that an error is in the second data item obtained in response to the read request.

Referring to section (b) of FIG. 6, the controller 130 can perform an exclusive OR (XOR) operation on four ECC values, so that it may be determined whether there is an error in the second data item Data Packet (new). The four ECC values include an even ECC value ECCe (old) and an odd ECC value ECCo (old) for the first data item, and an even ECC value ECCe (new) and an odd ECC value ECCo (new) for the second data item. When an exclusive OR operation is performed on the four ECC values ('101', '010', '000', '000'), the result of the exclusive OR operation becomes '111'.

According to an embodiment, when the result of the exclusive OR operation on the four ECC values includes all bits of '1', the controller 130 may determine that a 1-bit error is in the second data item Data Packet (new). When the result of the exclusive OR operation on the four ECC values includes all bits of '0', the controller 130 may determine that there is no error in the second data item Data Packet (new). In addition, when the result of the exclusive OR operation on the four ECC values includes bits of '1' and '0' (neither all '0' nor all '1'), the controller 130 may determine that there is an error of 2 bits or more in the second data item Data Packet (new).

Referring to section (b) of FIG. 6, the controller 130 can determine that there is an error of 1 bit in the second data item ('01010101') through the exclusive OR operation on the four ECC values. Referring to section (c) of FIG. 6, the controller 130 can perform an exclusive OR operation on the odd ECC value ECCo (old) for the first data item and the odd ECC value ECCo (new) for the second data item to determine which bit of the second data item is an error (e.g., a position of the 1-bit error among 8-bit data item). The result of the exclusive OR operation on the odd ECC value ECCo (old) for the first data item and the odd ECC value ECCo (new) for the second data item is '010'. Referring to section (a) of FIG. 5, the next most significant bit (the second most significant bit) can indicate an area corresponding to ¼ of the data item.

Referring to FIGS. 5 and 6, because there is an error in the odd ECC value, the controller 130 can recognize that the third least significant bit (Bit Position 2) among the 8-bit data item is an error. Accordingly, the code for correcting the error of the corresponding bit (the third least significant bit) is '00000100,' which can be obtained through the exclusive OR operation shown in section (c) of FIG. 6.

Referring to section (d) of FIG. 6, the controller 130 can perform an exclusive OR operation on the second data item ('01010101') and the code for correcting the error ('00000100'), to detect and correct the error of the second data item. As a result, the controller 130 can obtain an error-corrected data item ('01010001'), which is the same as the first data item that should have been stored in the memory device 150 referring to section (a) of FIG. 6.

In FIG. 6, an 8-bit data item is given as an example of detecting and correcting an error based on the hamming code. However, the Hamming code may be applicable to a data item of a different size, even a larger data item. For example, as the size of data increases, the method of detecting and correcting errors based on the Hamming code may become more effective. For example, when a 6-bit ECC value is used for data integrity of an 8-bit data item, the overhead is 75% in a view of memory space additionally used in the memory device 150. However, a pair of 12-bit ECC values (e.g., 24 bits for two ECC values) can be used for 512 bytes of data item (e.g., 4096 bits of data item). As a result, the overhead may be 0.06%. As the size of the data item stored in the memory device 150 increases, the overhead (ratio) can be reduced and thus resources of the memory system 110 may be efficiently used.

Figure 7:
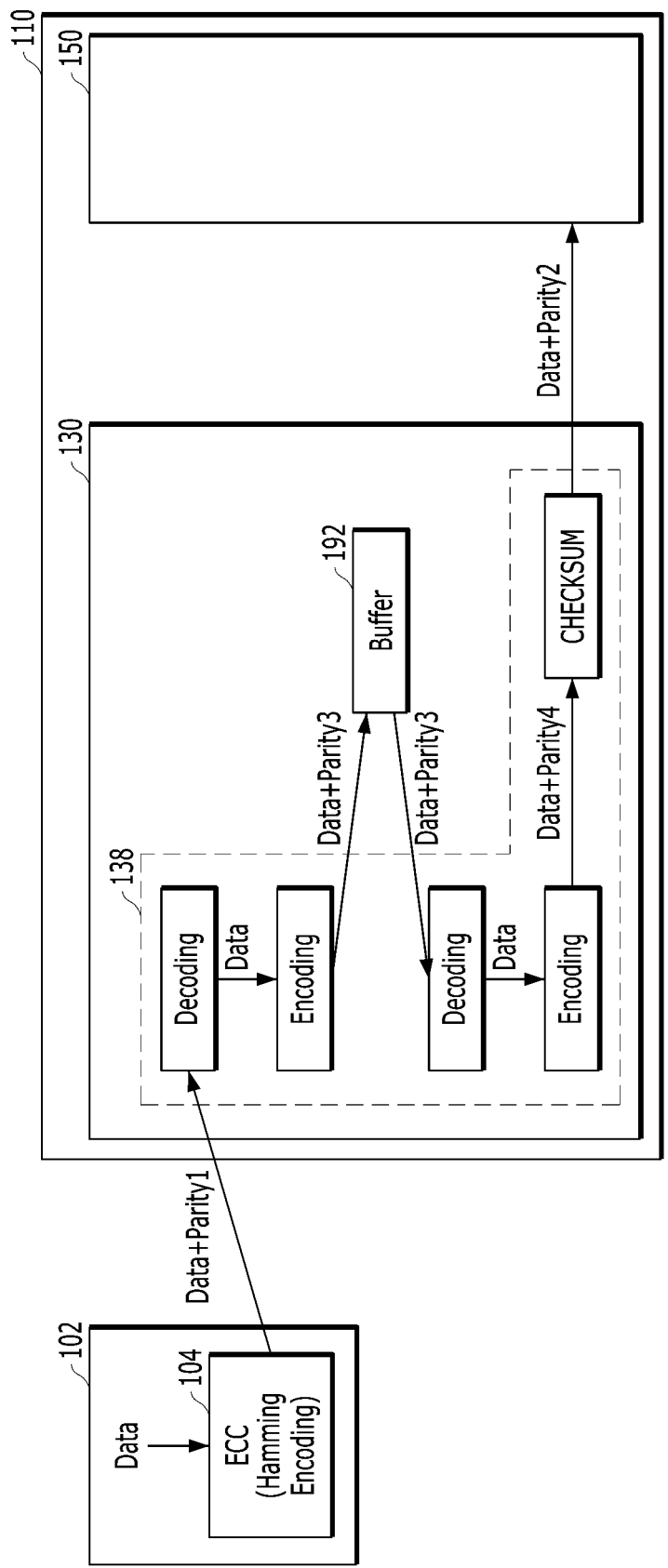
FIG. 7 illustrates an example of a data write operation in a data processing system.

FIG. 7 illustrates an example of a data write operation in a data processing system according to an embodiment. Herein, differences between the embodiments of FIGS. 1 and 7 are focused on for description.

Referring to FIG. 7, the host 102 in the data processing system can transmit the first encoded data item (Data+Parity1), which is encoded based on a Hamming code, to the memory system 110. However, the error correction circuitry 138 in the memory system 110 may perform encoding and decoding operations on a single data item many times.

After the error correction code (ECC) circuitry 104 in the host 102 encodes a data item based on the Hamming code, a first encoded data Data+Parity1 can be transmitted to the memory system 110. The error correction circuitry 138 in the controller 130 may decode the first encoded data Data+Parity1 to detect and correct an error, and may encode an error-corrected data item to generate a third encoded data item Data+Parity3. The third encoded data item Data+Parity3 may be stored in the buffer 192. The error correction circuitry 138 can perform a decoding operation based on the hamming code before storing the first encoded data Data+Parity1 transmitted from the host 102 in the buffer 192. The decoding operation can be used for detecting and correcting a first error occurring in data communication between the host 102 and the memory system 110. In addition, after correcting the first error, the error correction circuitry 138 can encode an error-corrected data item for detecting and correcting a second error, which may occur in the buffer 192, before storing the error-corrected data item in the buffer 192.

The error correction circuitry 138 may load and decode the third encoded data item Data+Parity3 stored in the buffer 192 to detect and correct the second error that may occur in the buffer 192. After correcting the second error, the error correction circuitry 138 can encode an error-corrected data item based on the hamming code to generate a fourth encoded data item Data+Parity4. Then, the error correction circuitry 138 can perform a checksum operation on the fourth encoded data item Data+Parity4 to generate a second encoded data item Data+Parity2. The second encoded data item Data+Parity2 may be transmitted to the memory device 150. In the checksum operation, for example, the error correction circuitry 138 can divide the fourth encoded data item Data+Parity4 into k sections, each section of n bits. All sections can be added together using one's complement to make a sum. The sum is complemented and added as a checksum field to generate the second encoded data item Data+Parity2.

The error correction circuitry 138 in the controller 130 may perform a plurality of decoding operations and a plurality of encoding operations to recognize and determine at which process or operation an error in a data item occurs. For example, the error correction circuitry 138 may detect and correct the first error (that may occur in data communication between the host 102 and the memory system 110) through the first decoding operation, as well as the second error that occurs in the buffer 192 through the second decoding operation. The error correction circuitry 138 may specify at which process or operation an error occurs. According to an embodiment, the memory system 110 can enhance or improve operational reliability of internal operations based on information regarding at which process or operation an error occurs.

According to an embodiment, the hamming code may be applied to a plurality of decoding operations and a plurality of encoding operations described in FIG. 7. According to one embodiment, encoding and decoding operations for detecting and correcting an error occurring in the buffer 192 or the memory device 150 can be performed based on a different error correction code corresponding to an internal configuration of the memory system 110.

Encoding and decoding operations using a hamming code can guarantee detection of a 2-bit error and correction of a 1-bit error, but in some cases a hamming code might not support correction of a 2-bit error. When a checksum is additionally performed as in the error correction circuitry 138 described in FIG. 7, the controller 130 can correct a 2-bit error when the 2-bit error occurs in a data item transmitted from the memory device 150.

Figure 8:
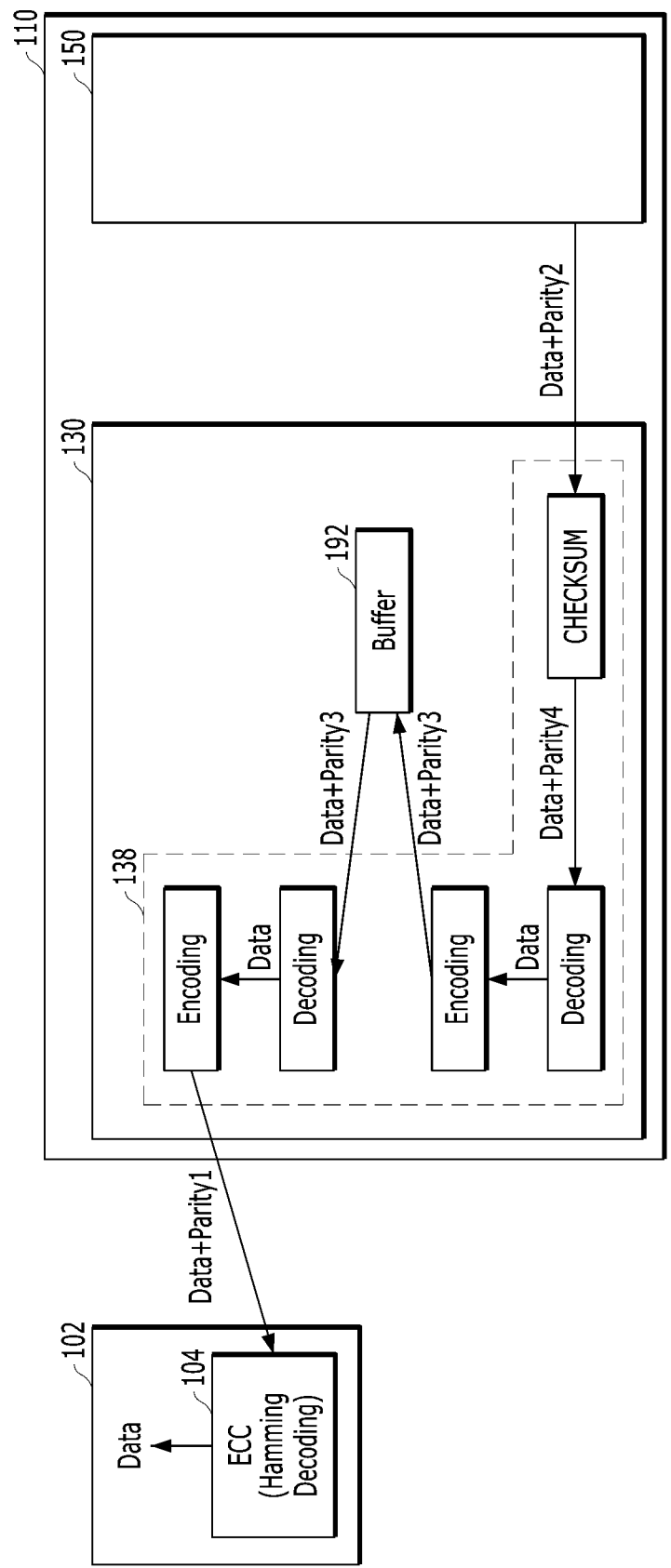
FIG. 8 illustrates an example of a data read operation in a data processing system.

FIG. 8 illustrates a data read operation performed in a data processing system according to an embodiment. In FIG. 8, when the error correction circuitry 138 in the controller 130 can perform a plurality of decoding operations and a plurality of encoding operations, the manner in which an operation is performed for outputting a data item corresponding to a read request from the host 102 will be described.

In this example, it may be assumed that, through error correction circuitry 138 described in FIG. 7, a data item corresponding to the read request may have been stored in the memory device 150. Referring to FIG. 8, a second encoded data item Data+Parity2 including the data item can be transmitted from the memory device 150 to the controller 130, in response to a read request input from the host 102.

The error correction circuitry 138 can decode the second encoded data Data+Parity2 based on a checksum to generate a fourth encoded data Data+Parity4, and then can decode the fourth encoded data Data+Parity4 based on the hamming code. These two decoding operations can support correction of 2-bit error occurring in data communication between the controller 130 and the memory device 150.

For example, the error correction circuitry 138 can divide the second encoded data (Data+Parity2) input from the memory device 150 into k sections, each of n bits. All sections may then be added together using one's complement to make a sum. The error correction circuitry 138 can complement the sum added to each other and check whether the result is zero. As described in FIG. 7, decoding operations performed based on a checksum and hamming code can detect and correct a 2-bit error included in the second encoded data item Data+Parity2 input from the memory device 150. The error correction circuitry 138 can further encode an error-corrected data items through the decoding operations based on the checksum and hamming code to generate a third encoded data Data+Parity3. Then, the error correction circuitry 138 can store the third encoded data item Data+Parity3 in the buffer 192.

After decoding the third encoded data item Data+Parity3 stored in the buffer 192 to detect and correct a second error that may occur in the buffer 192, the error correction circuitry 138 can encode an error-corrected data item based on the hamming code to generate a first encoded data item Data+Parity1. The controller 130 transmits the first encoded data item Data+Parity1 to the host 102 in response to the read request from the host 102.

The error correction code (ECC) circuitry 104 in the host 102 can decode the first encoded data item Data+Parity1 transmitted from the memory system 110 based on the hamming code, so that the host 102 can detect and correct a first error occurring in a data communication between the memory system 110 and the host 102.

The memory system 110 and the host 102 described in FIG. 8 can detect and correct an error that may occur at each step or operation in a procedure of reading a data item stored in the memory device 150 in response to a read request. As a result, the data processing system can increase operational reliability.

Figure 9:
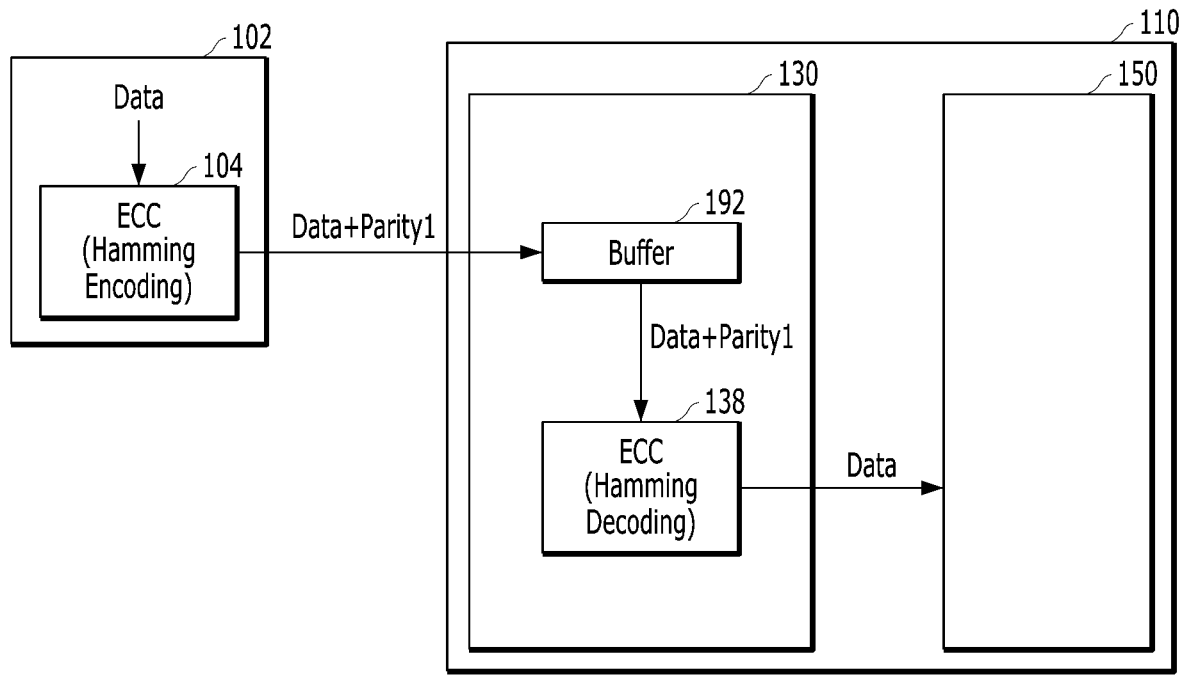
FIG. 9 illustrates an example of a data write operation in a data processing system.

FIG. 9 illustrates a data write operation performed in a data processing system according to an embodiment. The embodiment shown in FIG. 9 can simplify the encoding and decoding operation on a data item within the memory system 110, but the controller 130 can detect and correct a first error that may occur in a data communication between the host 102 and the memory system 110 and a second error that may occur in the buffer 192.

Referring to FIG. 9, the host 102 in the data processing system can transmit a first encoded data item Data+Parity1, encoded based on the hamming code, to the memory system 110. The controller 130 in the memory system 110 may receive the first encoded data item Data+Parity1 and store the first encoded data item Data+Parity1 in the buffer 192. The error correction circuitry 138 in the controller 130 loads the first encoded data item Data+Parity1 from the buffer 192. The error correction circuitry 138 may then perform a decoding operation based on the hamming code to detect and correct a first error occurring in a data transmission between the host 102 and the memory system 110 and/or a second error occurring in the buffer 192. The controller 130 may transmit a data item Data to the memory device 150 after the error correction circuitry 138 corrects the first error and/or the second error.

Through a single decoding operation, the error correction circuitry 138 can detect and correct two different types of errors, e.g., a first error occurring data transmission between the host 102 and the memory system 110 and a second error occurring in the buffer 192 within the memory system 110. In the embodiment illustrated in FIG. 9, the first and second errors can be detected and corrected, but the controller 130 can be simply configured. Further, because the controller 130 can transmit an unencoded data item to the memory device 150, overhead in data communications between the controller 130 and the memory device 150 may be reduced.

Figure 10:
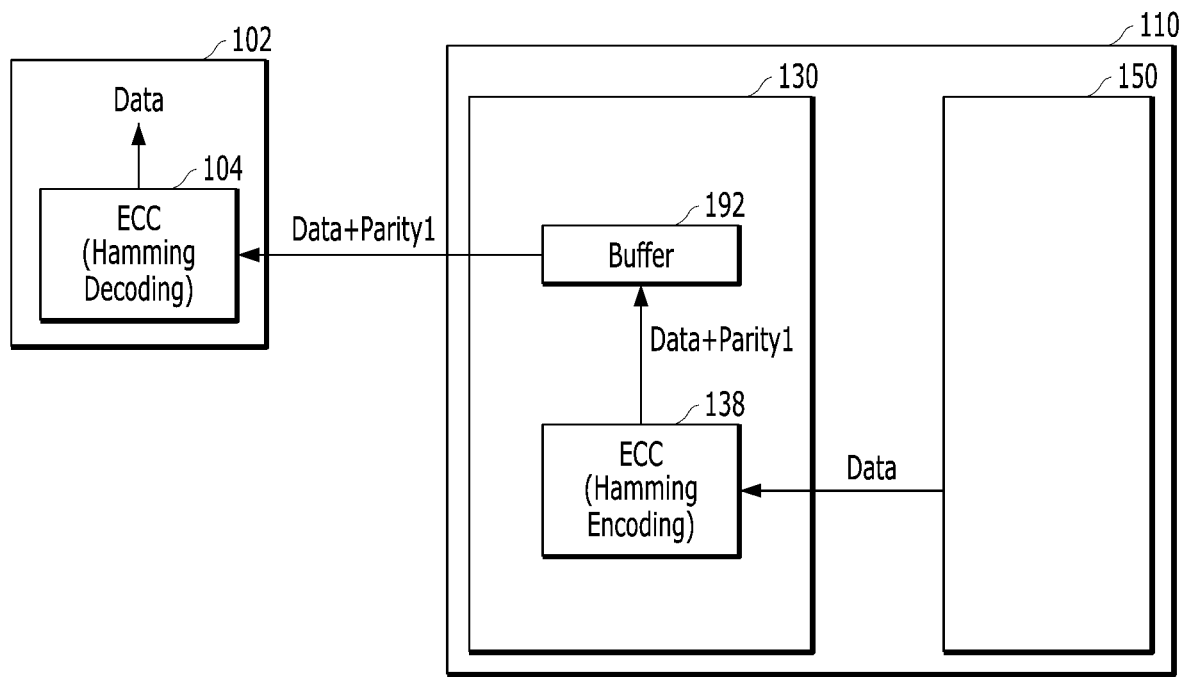
FIG. 10 illustrates an example of a data read operation in a data processing system.

FIG. 10 illustrates a data read operation in a data processing system according to an embodiment. In this embodiment, a read operation is described when the controller 130 of FIG. 9 transmits the unencoded data item to the memory device 150 for data program.

Referring to FIG. 10, memory device 150 may transmit a data item (corresponding to a read request) from the host 102 to the controller 130. The error correction circuitry 138 in the controller 130 may encode the data item based on the hamming code and then store the encoded data item Data+Parity1 in the buffer 192. As a response to the read request, the controller 130 may transmit the encoded data item Data+Parity1 stored in the buffer 192 to the host 102.

The error correction code (ECC) circuitry 104 in the host 102 can decode the encoded data item Data+Parity1 transmitted from the memory system 110, based on the hamming code, to detect and correct a first error that may occur in data communication between the memory system 110 and the host 102 and/or a second error that may occur in buffer 192.

Figure 11:
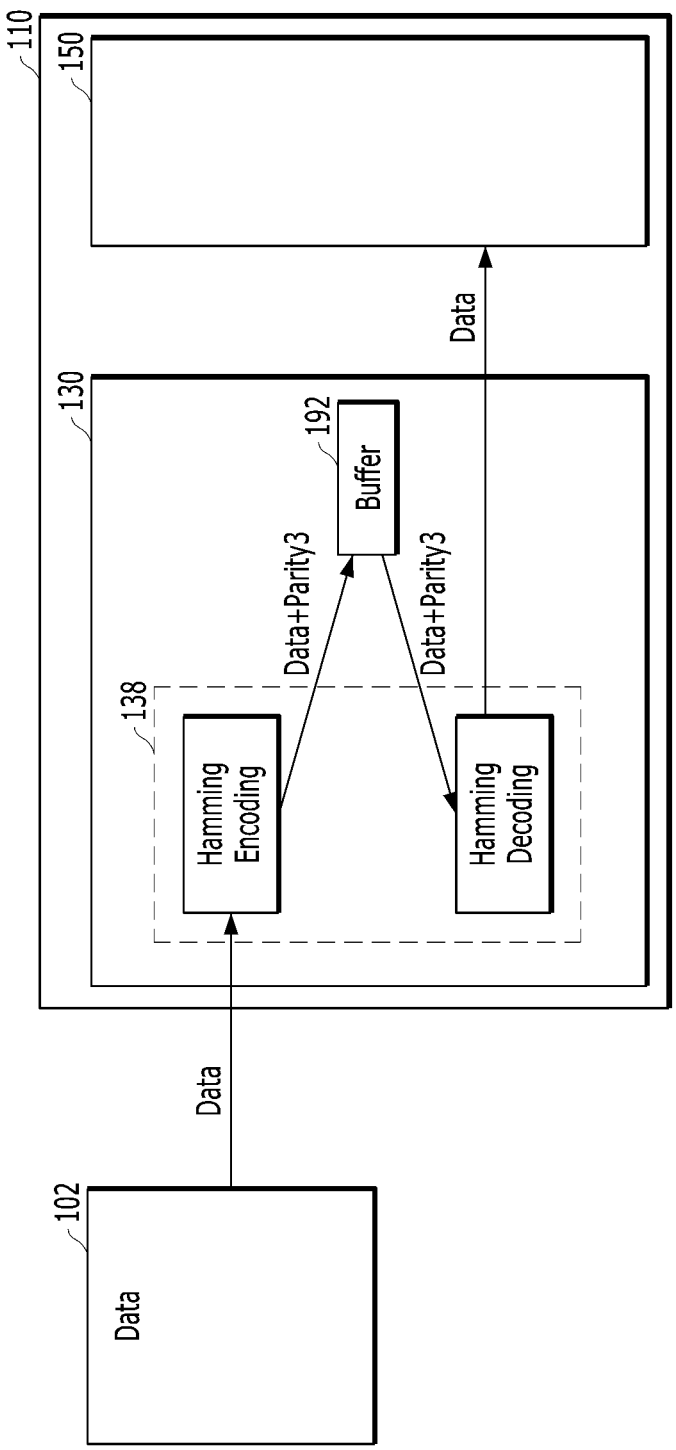
FIG. 11 illustrates an example of a data write operation in a data processing system.

FIG. 11 illustrates a data write operation in a data processing system according to an embodiment. Referring to FIG. 11, the host 102 may transmit a data item to the memory system 110. Because the host 102 can transmit the data item to the memory system 110 without an encoding operation, the error correction code (ECC) circuitry 104 might not be included in the host 102.

The error correction circuitry 138 in the controller 130 receiving the data item transmitted from the host 102 may encode the data item based on the hamming code to generate an encoded data item Data+Parity3. The error correction circuitry 138 can temporarily store the encoded data item Data+Parity3 in the buffer 192. Thereafter, the error correction circuitry 138 may load the encoded data item Data+Parity3 from the buffer 192 and perform a decoding operation based on the hamming code. Through these processes, the error correction circuitry 138 may detect and correct a second error that may occur in the buffer 192. The controller 130 may transmit an error-corrected data item to the memory device 150 for data program.

Figure 12:
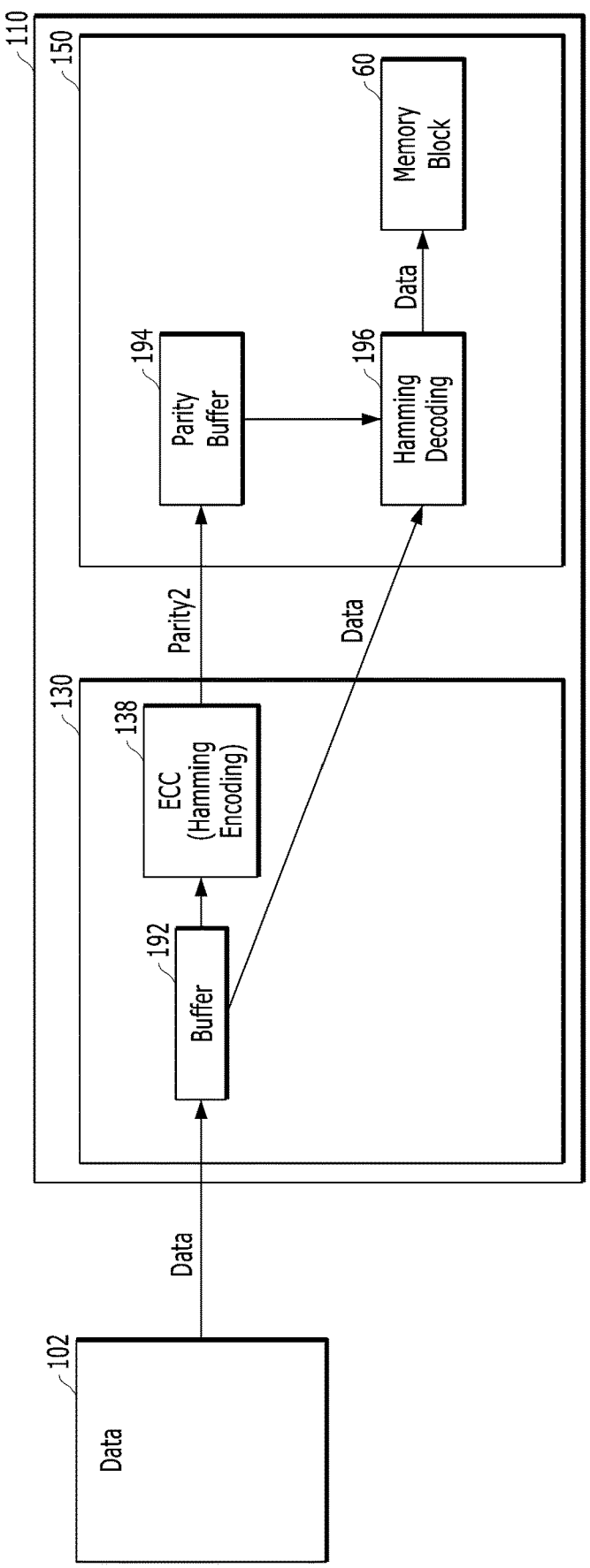
FIG. 12 illustrates an example of a data write operation in a data processing system.

FIG. 12 illustrates a data write operation in a data processing system according to an embodiment. Referring to FIG. 12, the host 102 may transmit a data item to the memory system 110. Because the host 102 transmits the data item to the memory system 110 without an encoding operation, the error correction code (ECC) circuitry 104 might not be included in the host 102.

The controller 130 in the memory system 110 receiving the data item Data input from the host 102 may temporarily store the data item Data in the buffer 192. The error correction circuitry 138 in the controller 130 may encode the data item Data stored in the buffer 192 based on the hamming code to generate a parity data item Parity2. The controller 130 may separate the data item Data stored in the buffer 192 from the parity data item Parity2 generated by the error correction circuitry 138, and transmit both the data item Data and the parity data item Parity2 to the memory device 150.

The memory device 150 may store the parity data item Parity2 transmitted from the controller 130 in a parity buffer 194. The memory device 150 can include another error correction circuitry 196. The error correction circuitry 196 can perform a decoding operation, based on the hamming code, on the data item Data transmitted from the controller 130 and the parity data item Parity2 stored in the parity buffer 194. Through these operations, the error correction circuitry 196 may detect and correct an error that may occur in data communication between the controller 130 and the memory device 150. Data item in which the error is corrected by the error correction circuitry 196 can be stored in the memory block 60 of the memory device 150.

In the embodiment described with reference to FIG. 12, because the memory device 150 includes the error correction circuitry 196, an error that may occur in a data communication between the controller 130 and the memory device 150 can be detected and corrected.

The error correction circuitry 196 in the memory device 150 can read a data item (corresponding to the host's read request) from the memory block 60, and then can encode the data item based on the hamming code to generate a parity data item. The memory device 150 can transmit the parity data item to the controller 130 for checking an error occurring in data communication between the memory device 150 and the controller 130.

In accordance with the above-described embodiment, memory system 110 may encode a data item before storing the data item in buffer 192 or may encode a data item to be transmitted to memory device 150. Further, the memory system 110 may decode a data item input from the host 102, load and decode a data item stored in the buffer 192 or decode a data item transmitted from the memory device 150. Depending on an embodiment, memory system 110 may selectively perform an encoding/decoding operation to detect and correct an error occurring inside the memory system 110 or in a data communication between the host 102 and the memory system 110. Such error detection and correction may improve or enhance operational reliability of the memory system 110.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, units, managers, multiplexers, generators, logic, interfaces, encoders, error correction circuits decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a memory system or a data processing system is provided which can increase or improve data processing reliability. In accordance with one or more embodiments, a memory system is provided that can determine in which operation an error occurs or the location where an error occurs in data. This determination can be made during data processing to store a data item (which is received from an external device such as a host) in a non-volatile memory device. As a result, error can be reduced when data processing is supplemented.

While the present teachings have been illustrated and described with respect to the specific embodiments, it will be apparent to those skilled in the art in light of the present disclosure that various changes and modifications may be made without departing from the spirit and scope of the disclosure as defined in the following claims. The embodiments may be combined to form additional embodiments.

What is claimed is:

1. A memory system comprising:
a memory device including non-volatile memory cells; and
a controller configured to control the memory device and coupled to a host via a communication channel, wherein the controller is further configured to:
receive, via the communication channel from the host, a first encoded data which is encoded based on a hamming code by the host;
decode the first encoded data to correct an error included in the first encoded data, the error occurring in the data receiving via the communication channel from the host;
encode the first error corrected data based on a low density parity check code to generate a second encoded data; and
transmit the second encoded data to the memory device to store the second encoded data in the non-volatile memory cells.

2. The memory system according to claim 1, wherein the controller further includes a data buffer, and
the first encoded data is temporarily stored in the data buffer before being decoded by the controller.

3. The memory system according to claim 2, wherein the first encoded data further includes an error including a bit flip generated by an operation or a structure of the data buffer storing the first encoded data.

4. The memory system according to claim 3, wherein the communication channel uses a NVMe interface.

5. The memory system according to claim 3, wherein the communication channel uses a SATA interface.

6. The memory system according to claim 3, wherein the second encoded data is encoded using a generator matrix code.

7. A memory system comprising:
a memory device including non-volatile memory cells; and
a controller configured to control the memory device and coupled to a host via a communication channel, wherein the controller is further configured to:
receive a read request from the host;
read a first encoded data stored in the non-volatile memory cells in response to the read request;
decode, based on a low density parity check code, the first encoded data to correct an error included in the first encoded data, the error caused by a change of threshold voltages while the first encoded data being stored in the non-volatile memory cells;
encode the first error corrected data based on a hamming code to generate a second encoded data; and
output the second encoded data to the host.

8. The memory system according to claim 7, wherein the controller performs a soft decision decoding to the first encoded data read from the non-volatile memory cells.

9. The memory system according to claim 8, wherein the controller further includes a data buffer, the second encoded data is temporarily stored in the data buffer before being output to the host.

10. The memory system according to claim 8, wherein the first encoded data is decoded based on a generator matrix code.

11. A memory system comprising:
a memory device including non-volatile memory cells; and
a controller configured to control the memory device and including a data buffer and an error correction circuitry, wherein the error correction circuitry is configured to:
receive, from the data buffer, a first encoded data which is encoded based on a first type of error correction code;
decode the first encoded data to correct an error included in the first encoded data, the error including a bit flip generated during an operation of the data buffer on the first encoded data;
encode the first error corrected data, based on a second type of error correction code different from the first type of error correction code, to generate a second encoded data; and
transmit the second encoded data to the memory device.

12. The memory system according to claim 11, wherein the first encoded data is decoded based on a hamming code, and the second type of error correction code is a low density parity check code.

13. A memory system comprising:
a memory device including non-volatile memory cells; and
a controller configured to control the memory device and coupled to a host via a communication channel, wherein the controller is further configured to:
receive, via the communication channel from the host, a first encoded data which is encoded based on a first type of error correction code by the host;
decode the first encoded data to correct an error included in the first encoded data, the error including a bit flip generated while receiving the data via the communication channel from the host;
encode the first error corrected data, based on a second type of error correction code different from the first type of error correction code, to generate a second encoded data; and
transmit the second encoded data to the memory device.

14. The memory system according to claim 13, wherein the second type of error correction code is a low density parity check code.

15. The memory system according to claim 13, wherein the first type of error correction code is a hamming code.

16. A memory system comprising:
a memory device including non-volatile memory cells; and
a controller configured to control the memory device and coupled to a host via a communication channel, wherein the controller is further configured to:
receive a data packet including a first encoded data and a first error correction parity corresponding to the first encoded data, the data packet transmitted from the host which includes a first error correction code circuitry, the first error correction parity generated based on a hamming code by the first error correction code circuitry of the host;
with a second error correction code circuitry in the controller, decode the first encoded data based on the first error correction parity to correct a first error in the data packet, the first error occurring in a data communication via the communication channel between the host and the controller;

encode the first error corrected data based on a low density parity check code to generate a second encoded data and a second error correction parity corresponding the second encoded data; and transmit the second encoded data and the second error correction parity to the memory device.

* * * * *